(12) United States Patent
Leung

(10) Patent No.: US 7,240,314 B1
(45) Date of Patent: Jul. 3, 2007

(54) REDUNDANTLY TIED METAL FILL FOR IR-DROP AND LAYOUT DENSITY OPTIMIZATION

(75) Inventor: Hardy Kwok-Shing Leung, San Jose, CA (US)

(73) Assignee: Magma Design Automation, Inc., San Jose, CA (US)

( * ) Notice: Subject to any disclaimer, the term of this patent is extended or adjusted under 35 U.S.C. 154(b) by 335 days.

(21) Appl. No.: 10/861,812

(22) Filed: Jun. 4, 2004

(51) Int. Cl.
  *G06F 17/50* (2006.01)
(52) U.S. Cl. .................................. 716/8; 716/9; 716/20
(58) Field of Classification Search .................... 716/8, 716/9, 20
See application file for complete search history.

(56) References Cited

U.S. PATENT DOCUMENTS

| | | | |
|---|---|---|---|
| 5,272,600 A | 12/1993 | Carey | |
| 5,602,423 A | 2/1997 | Jain | |
| 5,654,216 A | 8/1997 | Adrian | |
| 5,798,937 A | 8/1998 | Bracha et al. | |
| 5,846,854 A | 12/1998 | Giraud et al. | |
| 6,075,711 A | 6/2000 | Brown et al. | |
| 6,305,000 B1 | 10/2001 | Phan et al. | |
| 6,748,579 B2 * | 6/2004 | Dillon et al. | 716/19 |

FOREIGN PATENT DOCUMENTS

JP         2001274255 A   *  10/2001

OTHER PUBLICATIONS

Ali, I. et al., "Chemical Mechanical Polishing of Interlayer Dieletric: A Review," Solid State Technology, Oct. 1994, pp. 63-70, vol. 37, No. 10.

Chen, Y. et al., "Area Fill Synthesis for Uniform Layout Density," IEEE Transactions on Computer-Aided Design of Integrated Circuits and Systems, Oct. 2002, pp. 1132-1147, Vo. 21, No. 10.

Kouroussis, D. et al., "A Static Pattern-Independent Technique for Power Grid Voltage Integrity Verification," DAC 2003, Jun. 2-6, 2003, pp. 99-104.

Mitsuhashi, T. et al., "Power and Ground Network Topology Optimization for Cell Based VLSIs," 29th ACM/IEEE Design Automation Conference, 1992, pp. 524-529.

(Continued)

*Primary Examiner*—Sun James Lin
(74) *Attorney, Agent, or Firm*—Townsend and Townsend and Crew LLP

(57) ABSTRACT

An integrated circuit and a method for using metal fill geometries to reduce the voltage drop in power meshes. Metal fill geometries are connected to the power mesh using vias or wires at multiple locations. Metal fill geometries are connected to other floating metal fill geometries using vias or wires at multiple locations. The circuit design introduces maximum redundancy between metal fill geometries and power mesh geometries, but partial redundancy between metal fill geometries and metal fill geometries. In particular, the redundancy in connectivity between metal fill geometries and metal fill geometries is kept minimal to reduce the number of geometries introduced. The high redundancy between metal fill geometries and power mesh geometries and the partial redundancy among metal fill geometries result in a smaller IR-drop by reducing the effective resistance on a power mesh. Hence, the invention use redundancy carefully and advantageously to achieve simultaneous metal density and IR-drop optimization without introducing excessive number of metal fill geometries.

23 Claims, 23 Drawing Sheets

OTHER PUBLICATIONS

Nanz, G. et al., "Modeling of Chemical-Mechanical Based Polishing: A Review," IEEE Transactions on Semiconductor Manufacturing, Nov. 1995, pp. 382-389, vol. 8, No. 4.

Qian, H. et al., "Early-Stage Power Grid Analysis for Uncertain Working Modes," IEEE Transactions on Computer-Aided Design of Intergrated Circuits and Systems, May 2005, pp. 676-682, vol. 24, No. 5.

Singh, J. et al., "Topology Optimization of Structured Power/Ground Networks," ISPD'04, Apr. 18-21, 2004, pp. 116-123.

"SPIDER: Simultaneous Post-Layout IR-Drop and Metal Density Enhancement with Redundant Fill," ICCAD '05, Nov. 6-10, 2005, 6 pages.

Stine, B.E. et al., "The Physical and Electrical Effects of Metal-Fill Patterning Practices for Oxide Chemical-Mechanical Polishing Processes," IEEE Transactions on Electron Devices, Mar. 1998, pp. 665-679, vol. 45, No. 3.

Su, H. et al., "Fast Analysis and Optimization of Power/Ground Networks," IEEE/ACM International Conference on Computer-Aided Design, Nov. 5-9, 2000, pp. 477-480.

Tan, X. D. S. et al., "Fast Power/Ground Network Optimization Based on Equivalent Circuit Modeling," DAC 2001, Jun. 18-22, 2001, pp. 550-554.

Wang, T. et al., "Optimization of the Power/Ground Network Wire-Sizing and Spacing Based on Sequential Network Simplex Algorithm," 6 Pages. Mar. 2002.

Wu, X. et al., "Area Minimization of Power Distribution Network Using Efficient Nonlinear Programming Techniques," IEEE, 2001, pp. 153-157.

* cited by examiner

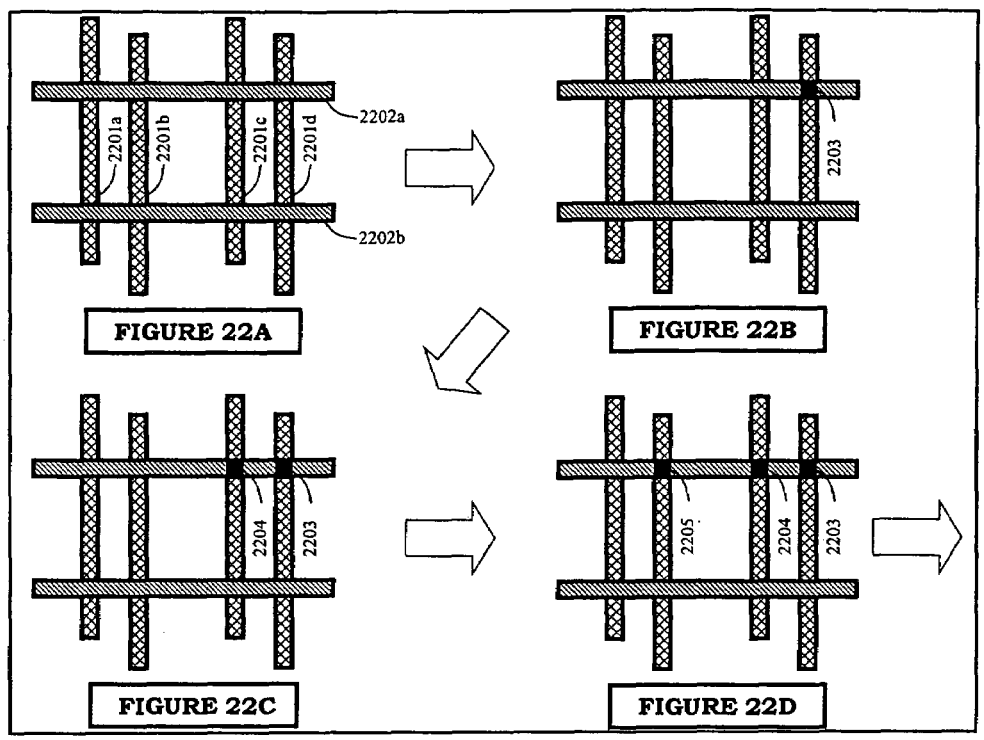
FIGURE 22A
FIGURE 22B
FIGURE 22C
FIGURE 22D
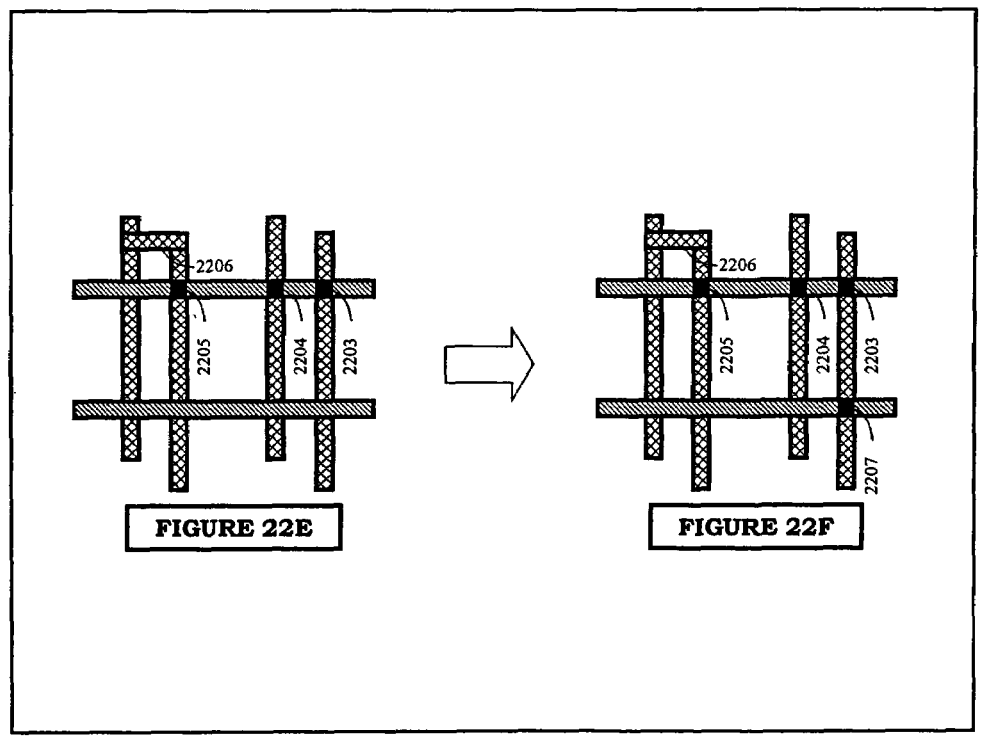
FIGURE 22E
FIGURE 22F

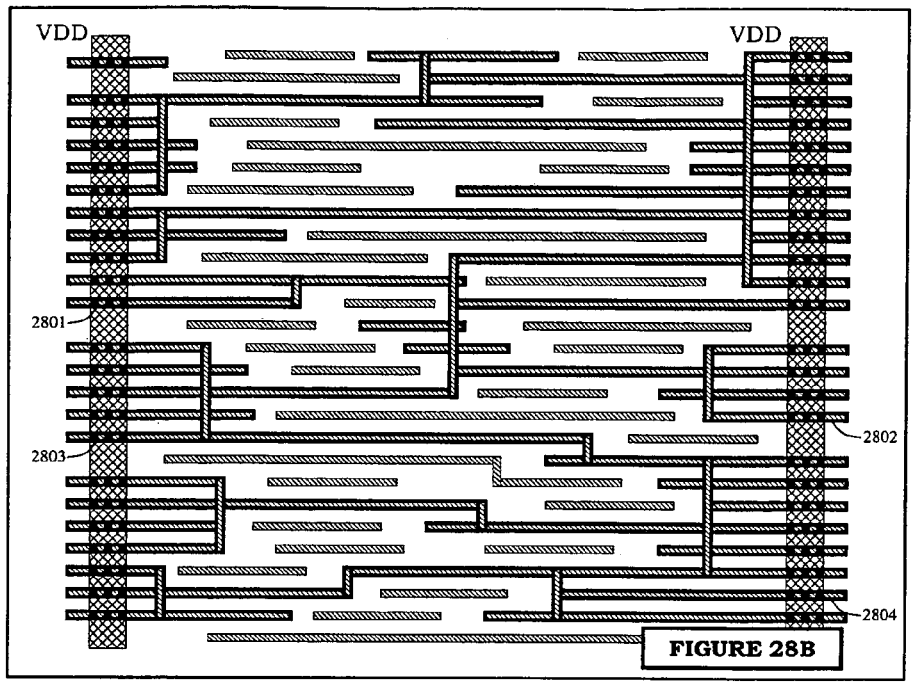
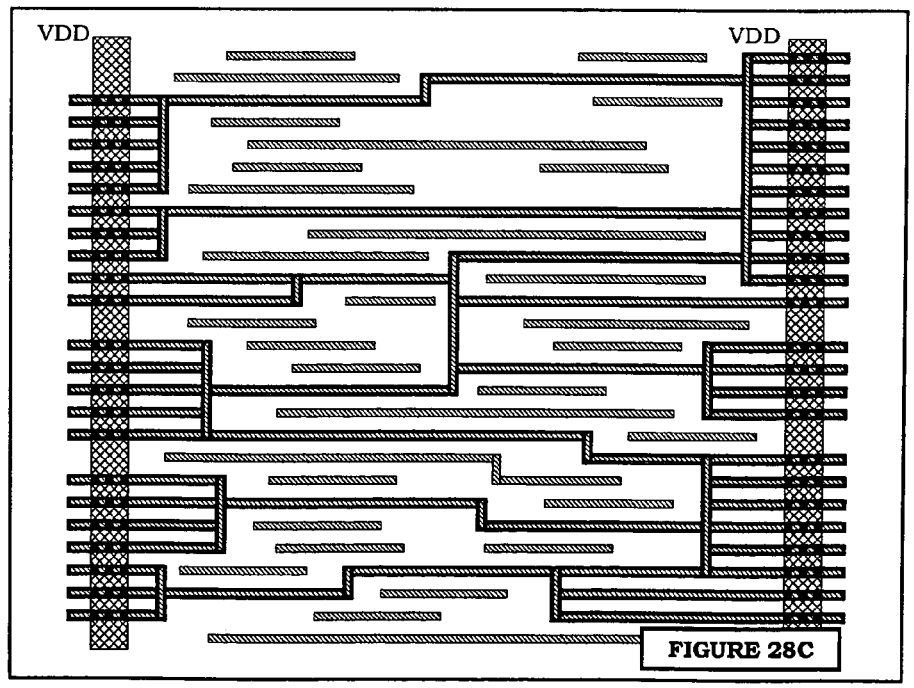

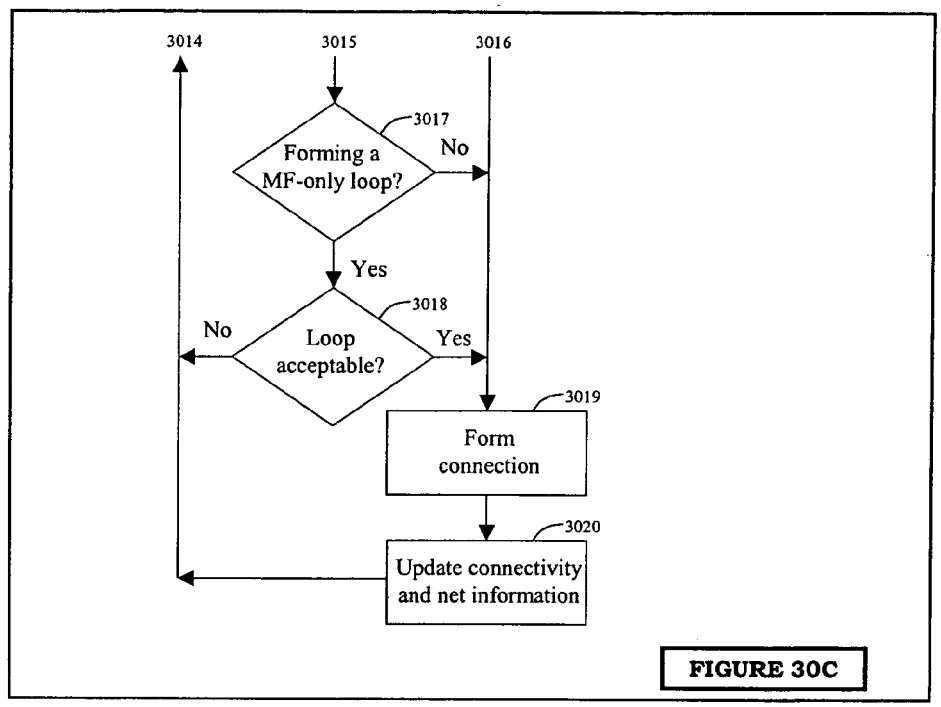
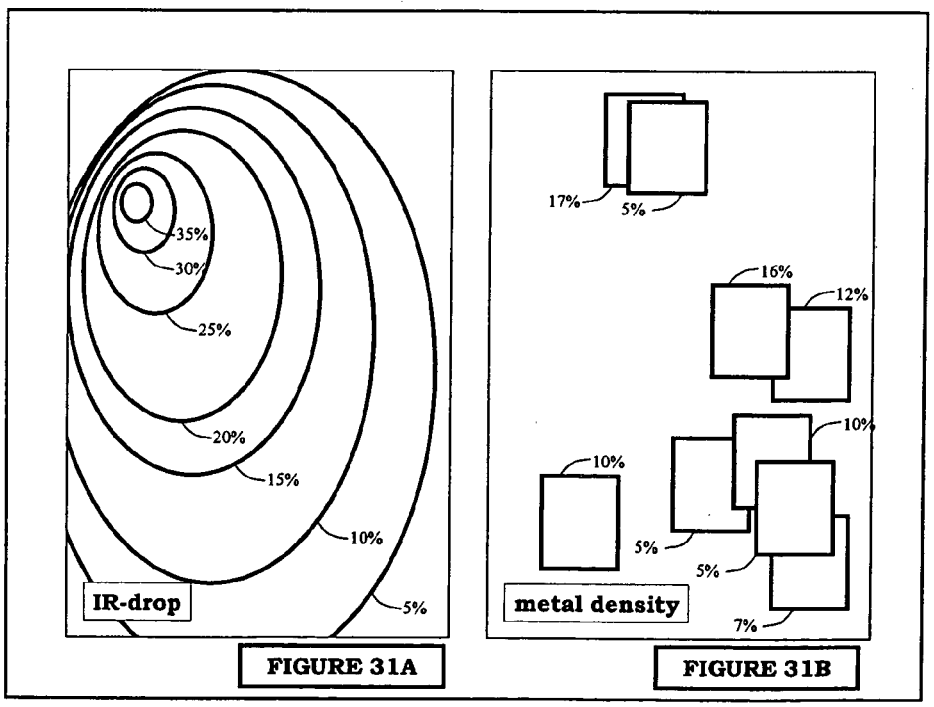

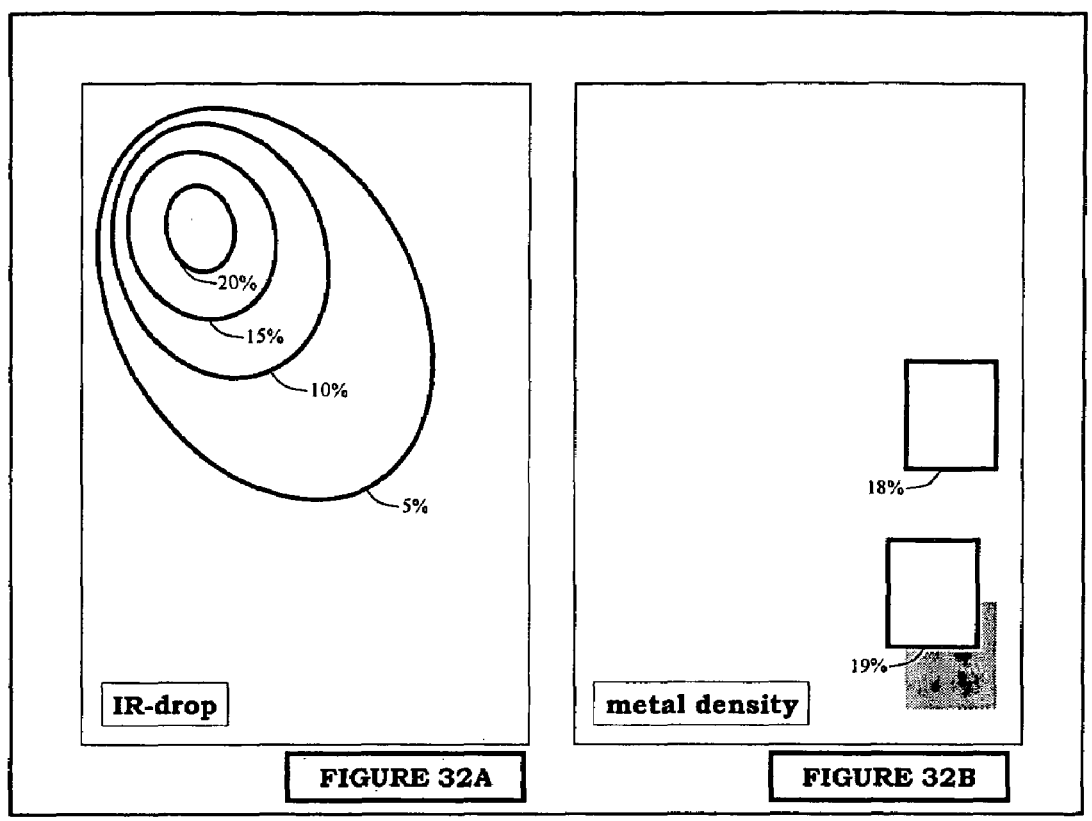

REDUNDANTLY TIED METAL FILL FOR IR-DROP AND LAYOUT DENSITY OPTIMIZATION

BACKGROUND OF THE INVENTION

1. Field of the Invention

The present invention relates generally to the design of semiconductor integrated circuits ("ICs") and more specifically, to using redundantly tied metal fill for voltage drop (as a function of current and resistance, also referred to as "IR-drop") and layout density optimization.

2. Background of the Invention

Semiconductor integrated circuits (ICs) are typically composed of layer structures consisting of several layers of conducting, insulating and other materials. These materials are structured in the horizontal dimension by fabrication processes that transfer patterns defined in physical designs or layouts. Further, IC design processes typically employ various rules to ensure uniform density requirements and signal integrity requirements.

The multilayer interconnect in ICs allow various transistors to be connected to complete a circuit. In the metal layers of an IC chip, there are some areas with high interconnect density and others with low density. Certain fabrication processing steps, such as the chemical mechanical polishing ("CMP") process used for planarizing interlayer dielectrics, have varying effects on device and interconnect features depending on local characteristics of the layout. To make these effects uniform and predictable, the layout itself must be made uniform with respect to certain density parameter. Traditional methods to achieve uniformity include insertion ("filling") or partial deletion ("slotting") of features in the layout. Uniformity of CMP depends on uniformity of features on the interconnect layer beneath a given dielectric layer to avoid dishing and other irregularities. Metal-fill patterning is the process of filling the large open areas on each metal layer with a metal pattern, which is either grounded or left floating, to compensate for pattern-driven variation. A metal fill can be floating or tied. A tied metal fill is connected to ground or power. A floating metal fill is not connected to a ground or power and is electrically floating. A problem with floating metal fill geometries is that their capacitive values are unknown and they will capacitively couple with the signal lines above and below.

Another challenge in IC design involves failures caused by signal integrity problems. IR drop is one such signal integrity effects caused by wire resistance and current drawn from the power and ground grids. If the wire resistance is too great or the cell current is higher than predicted, an unacceptable voltage drop may occur. The voltage drop causes the voltage supplied to the affected cells to be lower than required, leading to larger gate and signal delays, which in turn can cause timing degradation in the signal paths as well as clock skew. In the worst case, the voltage drop may be large enough that transistors fail to switch correctly, causing the chip to fail.

In most conventional IC design flows, signal integrity analysis is performed as a post-layout activity. Attempting to analyze and correct for these issues post-layout often results in costly and time-consuming design iterations, failed schedules, reduced product performance and even larger die sizes with poorer manufacturing yield.

It is therefore desirable to improve on existing methods to address signal integrity and metal-fill issues as an integral part of the design flow.

SUMMARY OF THE INVENTION

Accordingly, the present invention is directed to a method and system for adding metal fill geometries in the layout in a manner which concurrently satisfies the metal density requirements and the voltage drop (as a function of current and resistance, "IR drop") requirements.

The present invention advantageously uses tied metal filling to reduce the voltage drop in a power mesh by introducing redundancy. Floating metal fill geometries are redundantly connected to the power mesh whenever possible, by adding vias or by making same-layer "bridge" connections, while ensuring design-rule correctness. Furthermore, metal fill geometries are redundantly connected to neighboring metal fill geometries to establish additional connectivity between power mesh geometries. While the system seeks maximally redundant connectivity between metal fill geometries and power mesh geometries, the system only seeks partially redundant connectivity between metal fill geometries and other metal fill geometries. This is done to avoid excessive increase in the number of metal fill geometries introduced.

The redundancy adds more pathways for current flow between different points of the power mesh, hence reducing IR drop by reducing the effective resistance on a power mesh. Thus, the present invention advantageously uses metal fill geometries to reduce the voltage drop in a power mesh, and concurrently satisfies the IR drop requirements and the layout density requirements.

The features and advantages described in the specification are not all inclusive and, in particular, many additional features and advantages will be apparent to one of ordinary skill in the art in view of the drawings, specification, and claims. Moreover, it should be noted that the language used in the specification has been principally selected for readability and instructional purposes, and may not have been selected to delineate or circumscribe the inventive subject matter.

BRIEF DESCRIPTIONS OF THE DRAWINGS

The invention has other advantages and features which will be more readily apparent from the following detailed description of the invention and the appended claims, when taken in conjunction with the accompanying drawings, in which:

Figure 2:
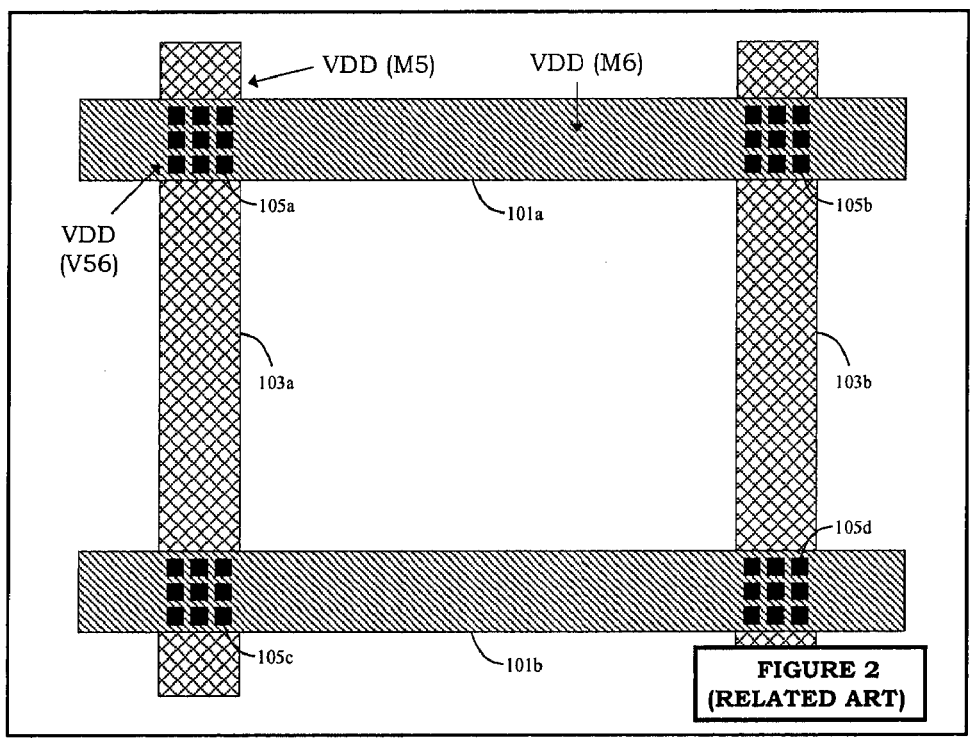
FIG. 2 is a simplified version of FIG. 1 showing only an enlarged view of the power (VDD) mesh structure.
Figure 2A:
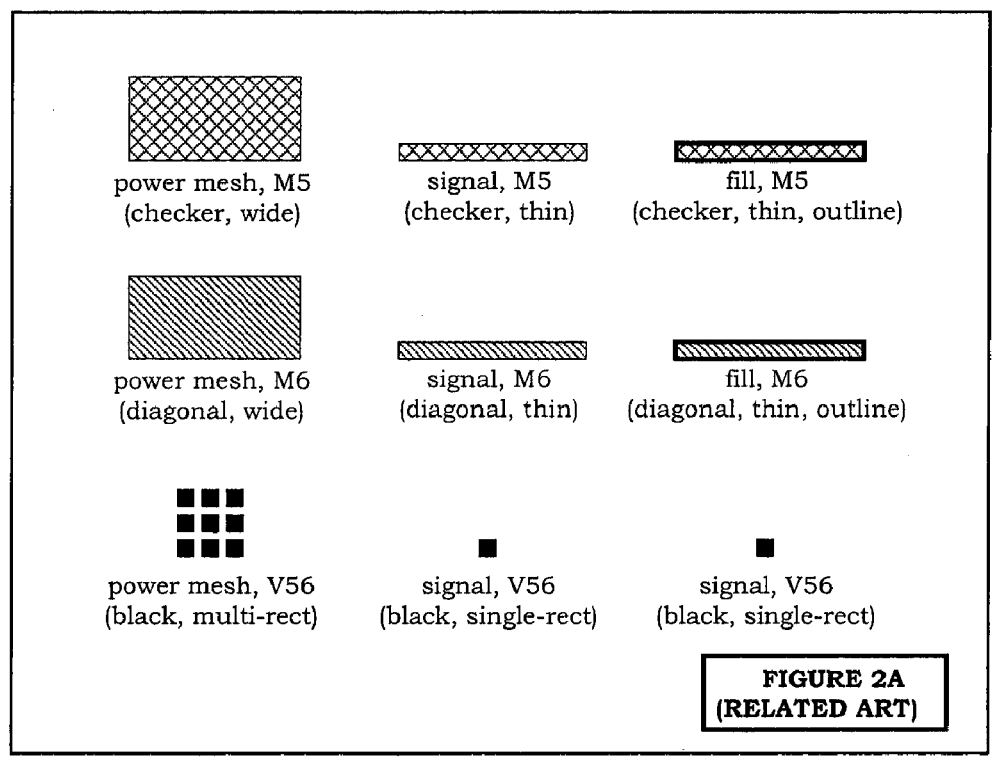

FIG. 2A describes the convention used to describe power mesh geometries, signal routing geometries, and metal fill geometries.

Figure 3:
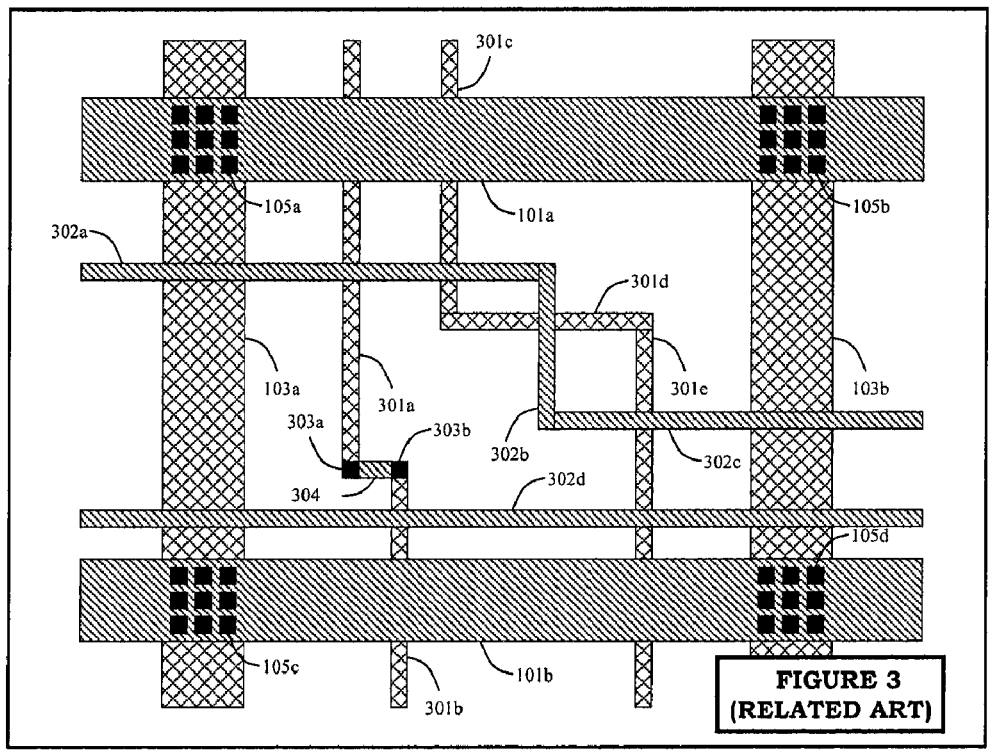

FIG. 3 illustrates the layout in FIG. 2, with the actual signal routing geometries added to the figure.

Figure 4:
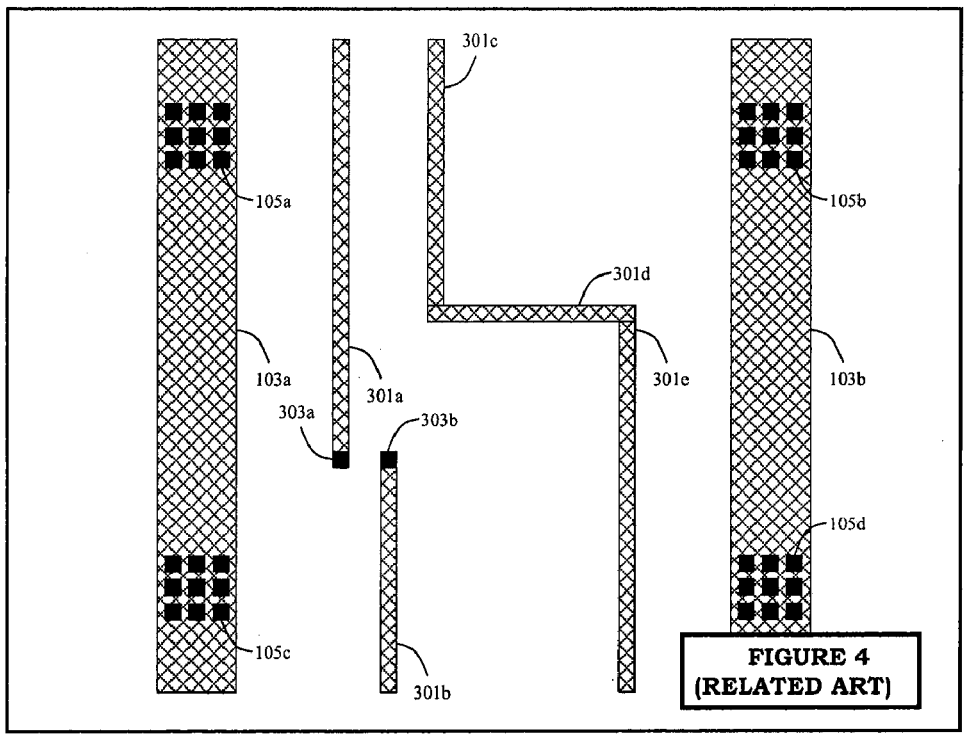

FIG. 4 illustrates the layout in FIG. 3, showing only M5.

Figure 5:
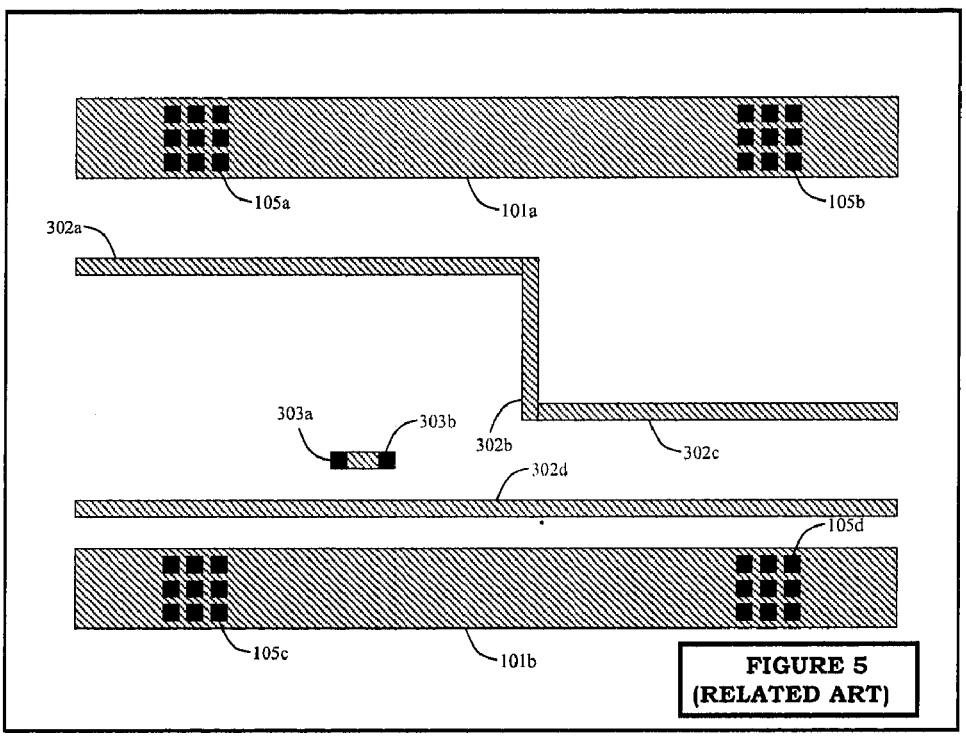

FIG. 5 illustrates the layout in FIG. 3, showing only M6.

Figure 6:
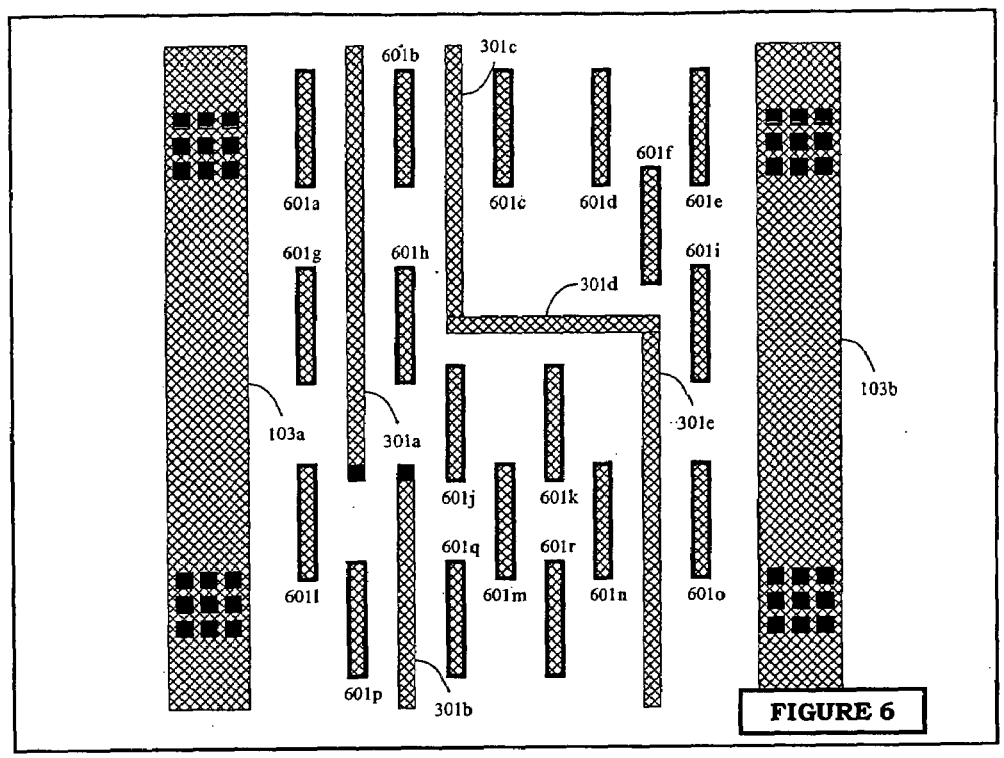

FIG. 6 illustrates the layout in FIG. 3, showing floating metal fill geometries added to satisfy metal density requirements on M5. A pattern of staggered metal fill geometries is used.

Figure 7:
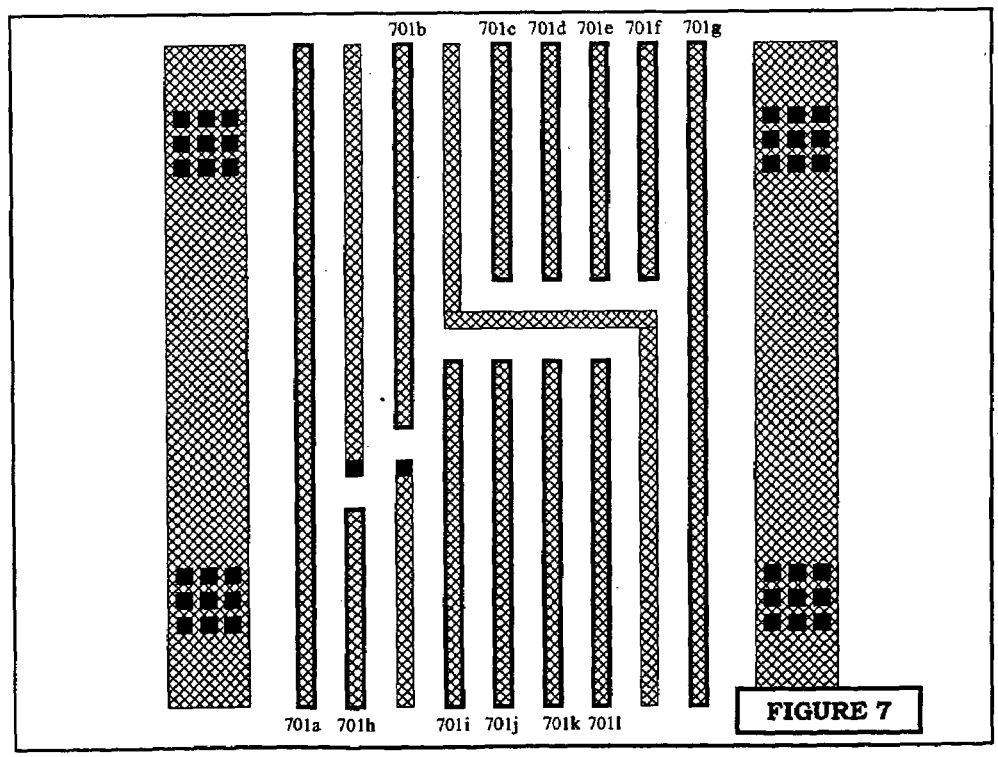

FIG. 7 illustrates the layout in FIG. 3, showing floating metal fill geometries added to satisfy metal density requirements on M5. Long stripes of metal fill geometries are used.

Figure 8:
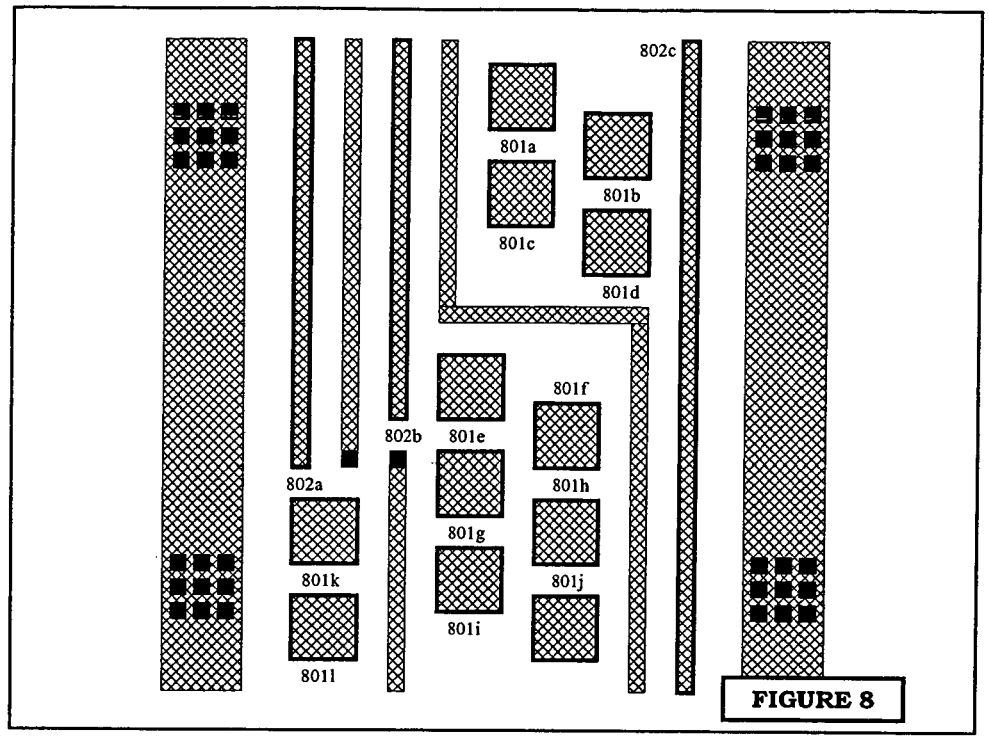

FIG. 8 illustrates the layout in FIG. 3, showing floating metal fill geometries added to satisfy metal density requirements on M5. The metal fill geometries consist of both fat squares and long stripes.

Figure 9:
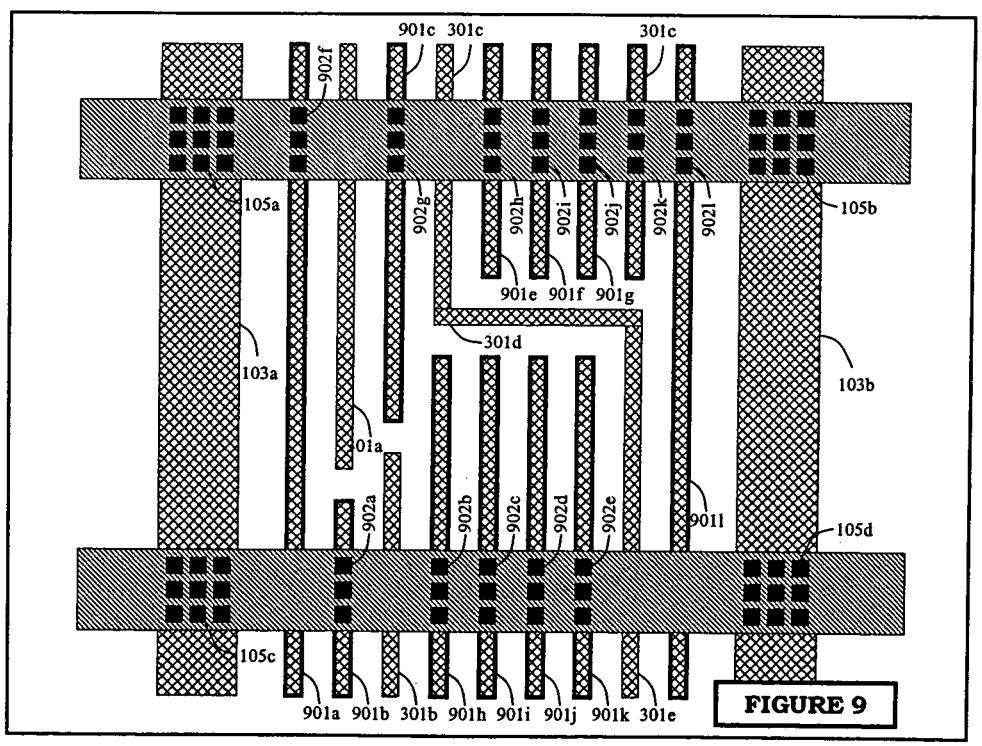

FIG. 9 illustrates the layout in FIG. 3, showing tied metal fill geometries added to satisfy metal density requirements on M5. Long stripes of metal fill geometries are added, and they are connected to the power mesh using vias.

Figure 10:
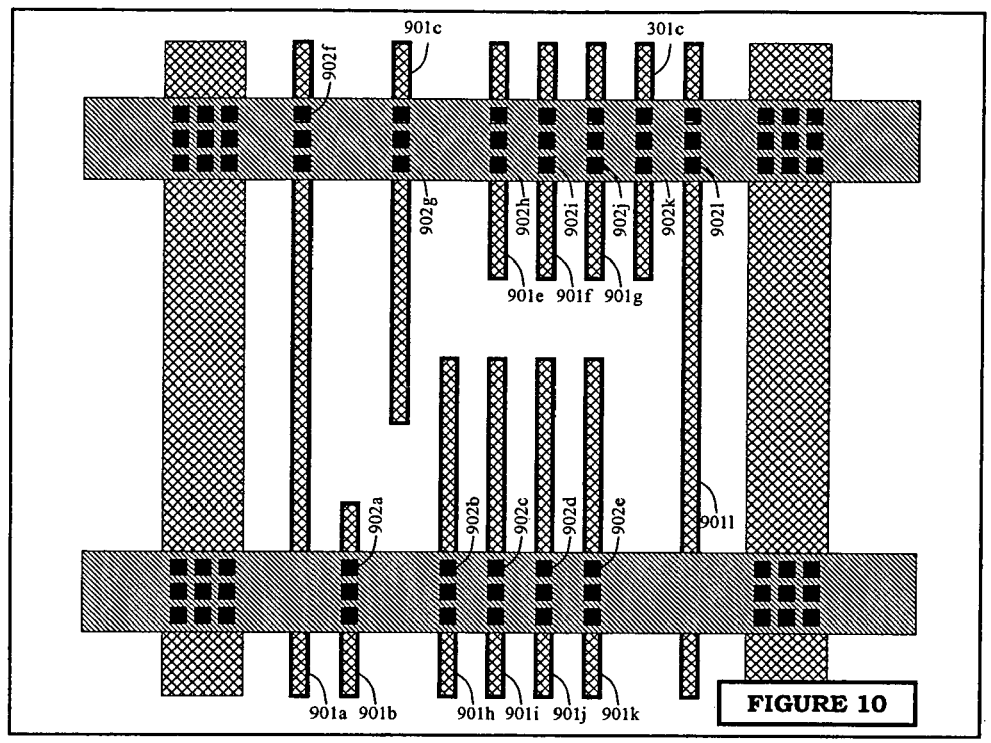

FIG. 10 illustrates the layout in FIG. 9, showing only mesh and metal fill geometries, and omitting signal routing.

Figure 11:
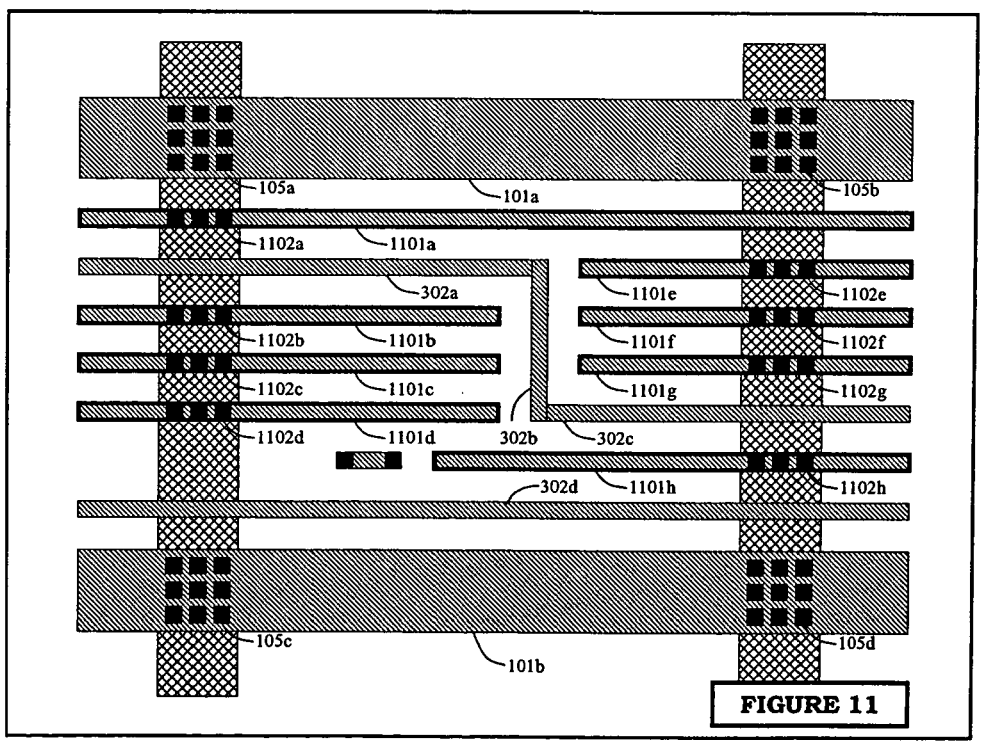

FIG. 11 illustrates the layout in FIG. 3, showing tied metal fill geometries added to satisfy metal density requirements on M6. Long stripes of metal fill geometries are added, and they are connected to the power mesh using vias.

Figure 12:
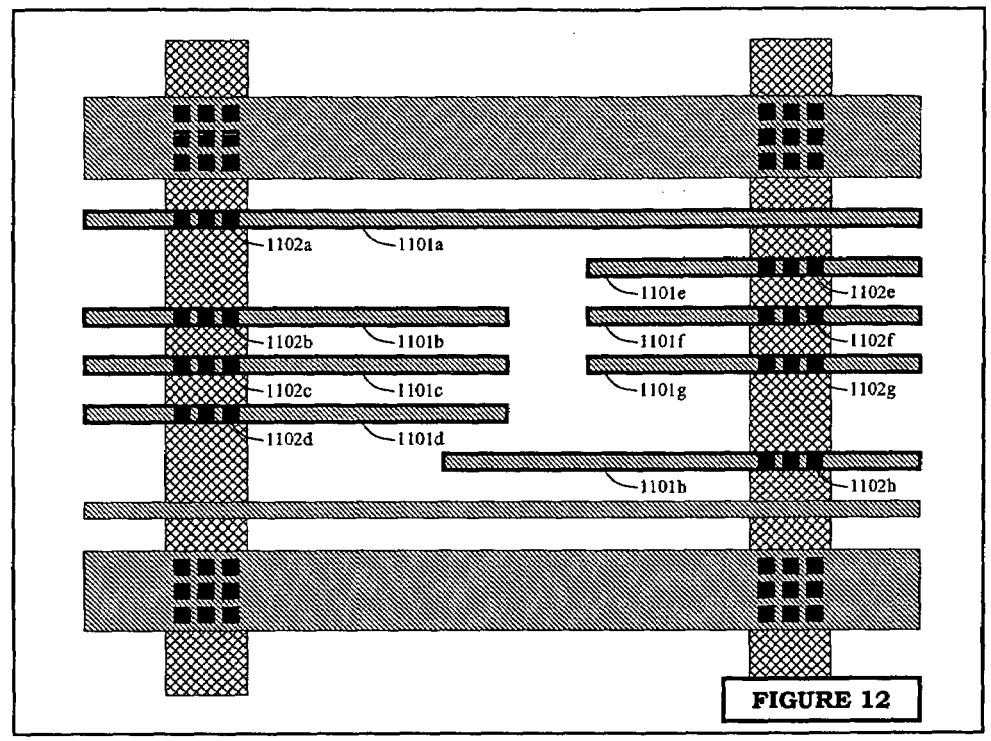

FIG. 12 illustrates the layout in FIG. 11, showing only mesh and metal fill geometries, and omitting signal routing.

Figure 13:
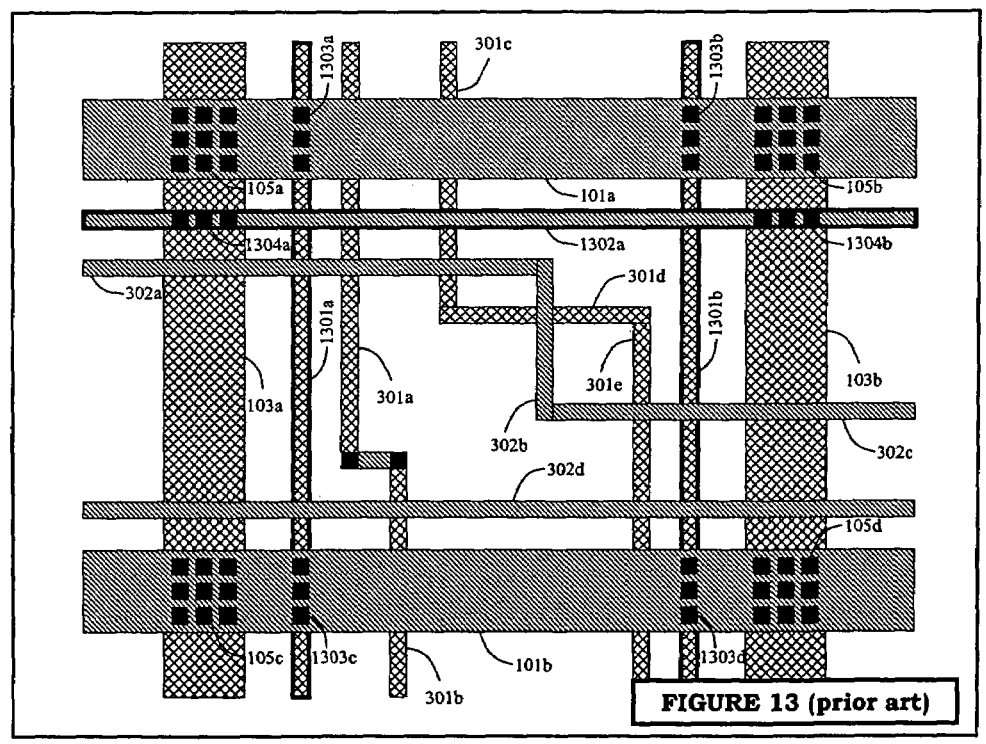

FIG. 13 illustrates the layout in FIG. 3, showing tied metal fill geometries added to satisfy metal density requirements as described by prior art methods. Long stripes of metal fill geometries are added, and they are connected to the power mesh using vias. The metal fill geometries added do not connect to each other.

Figure 14:
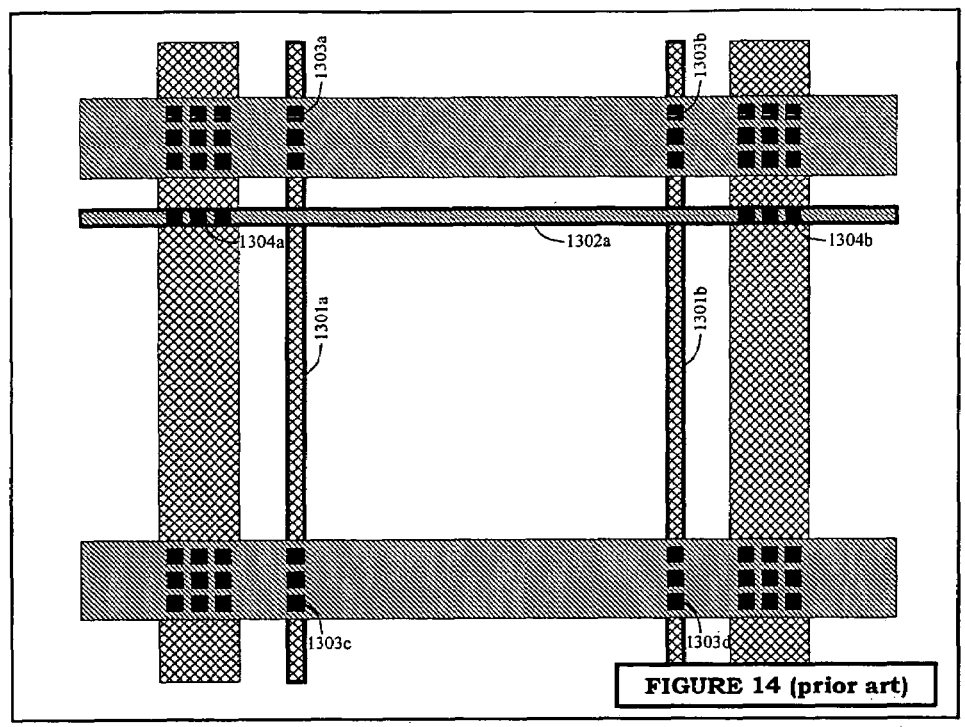

FIG. 14 illustrates the layout in FIG. 13, showing only mesh and metal fill geometries, and omitting signal routing.

Figure 15:
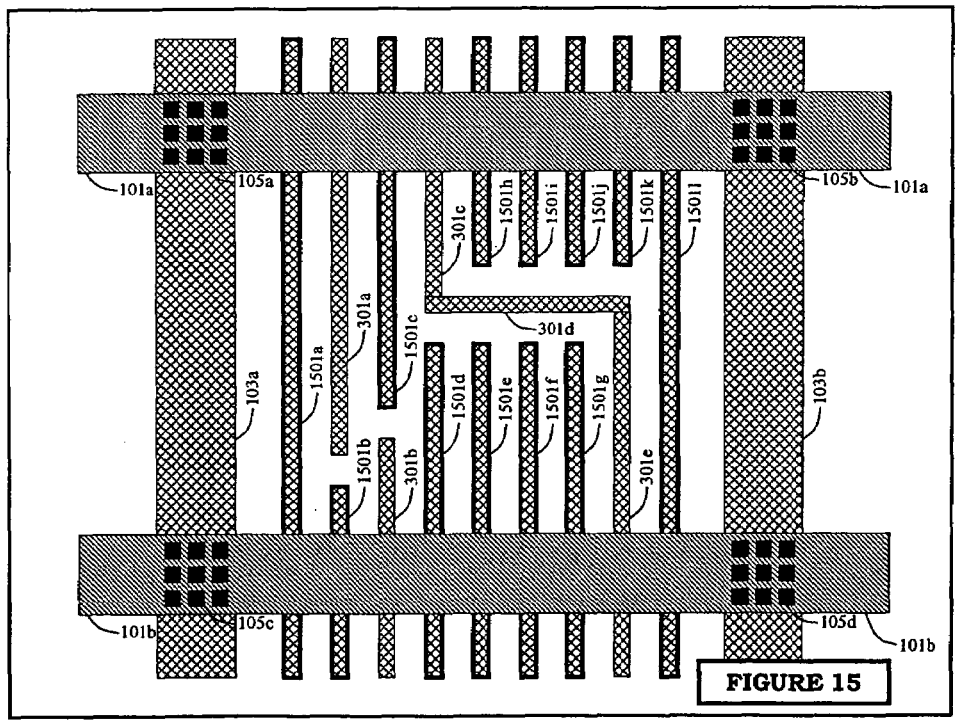

FIG. 15 illustrates the layout in FIG. 3 (M5 only), showing floating metal fill geometries added as a first step of the present invention.

Figure 16:
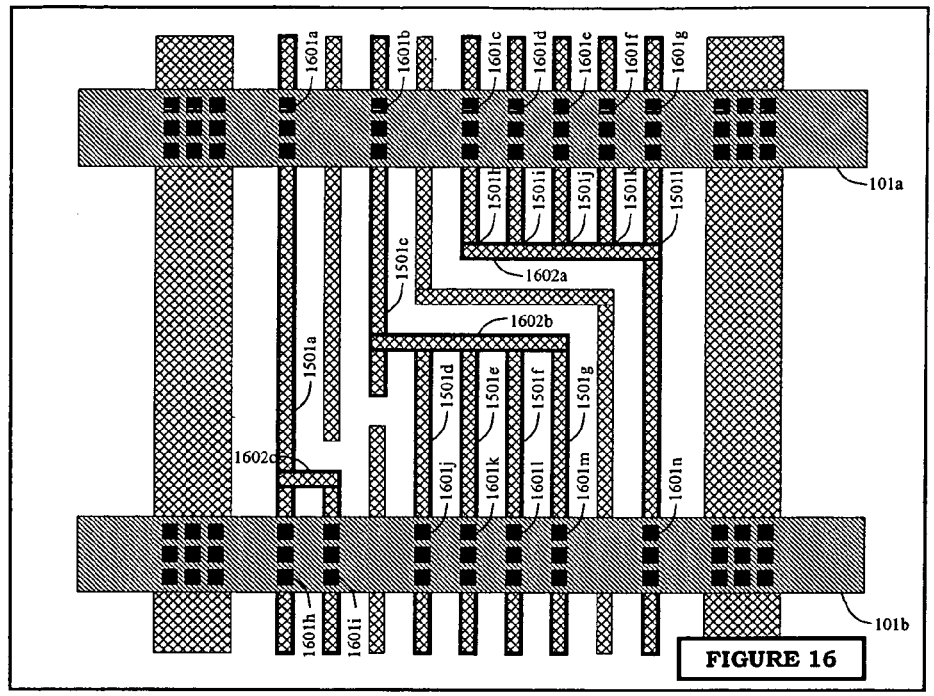

FIG. 16 illustrates the layout in FIG. 15 (M5 only), showing the addition of vias and additional metal fill geometries to establish redundant connection for IR-drop reduction.

Figure 17:
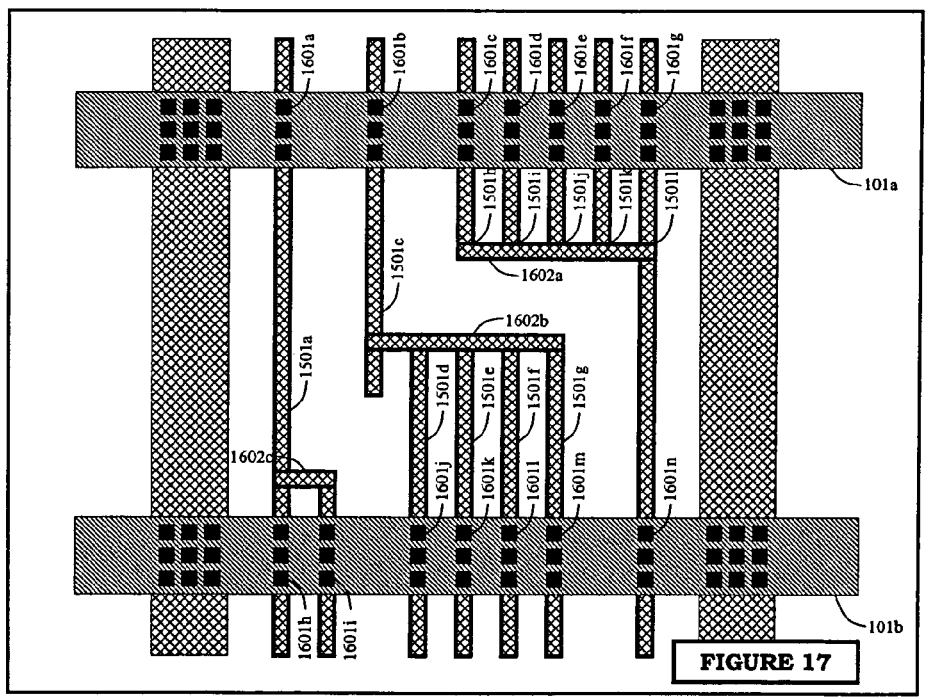

FIG. 17 illustrates the layout in FIG. 16 (M5 only), showing only mesh and metal fill geometries, and omitting signal routing.

Figure 18:
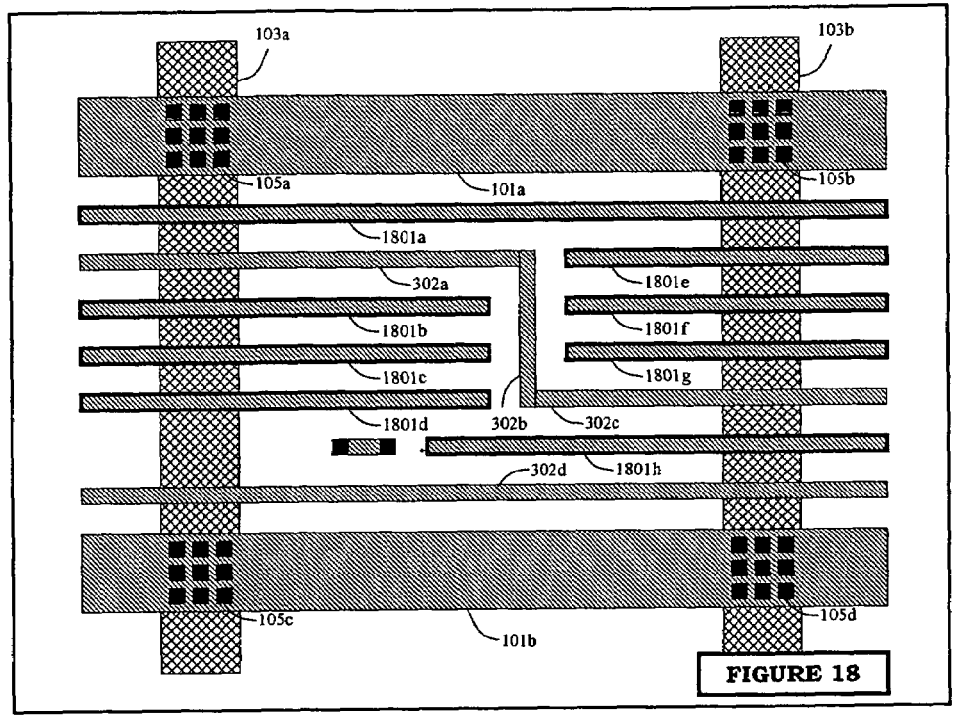

FIG. 18 illustrates the layout in FIG. 3 (M6 only), showing floating metal fill geometries added as a first step of the present invention.

Figure 19:
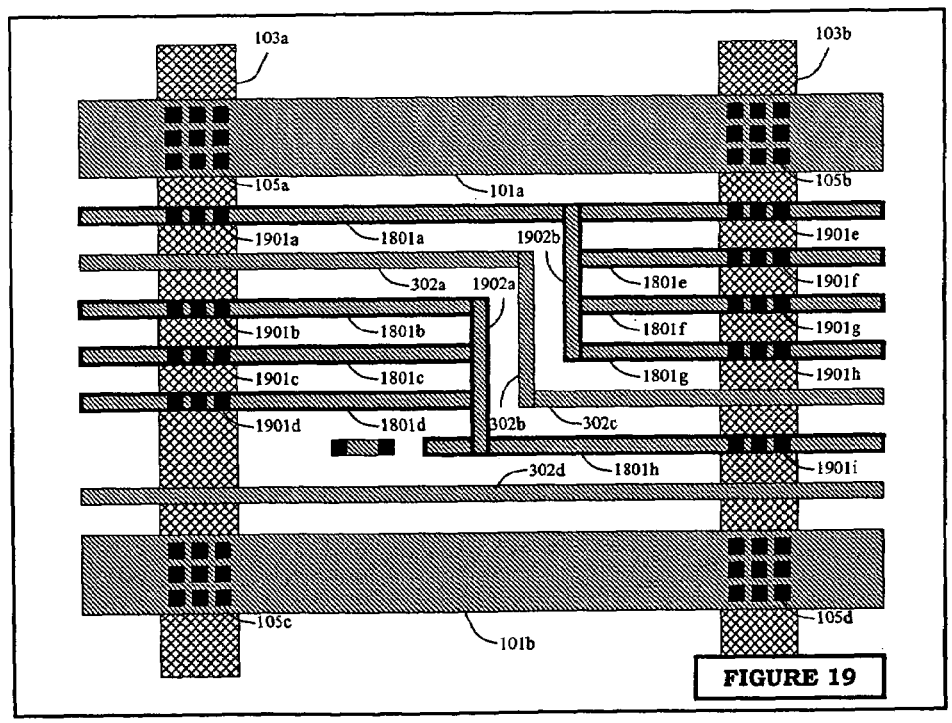

FIG. 19 illustrates the layout in FIG. 18 (M6 only), showing the addition of vias and additional metal fill geometries to establish redundant connection for IR-drop reduction.

Figure 20:
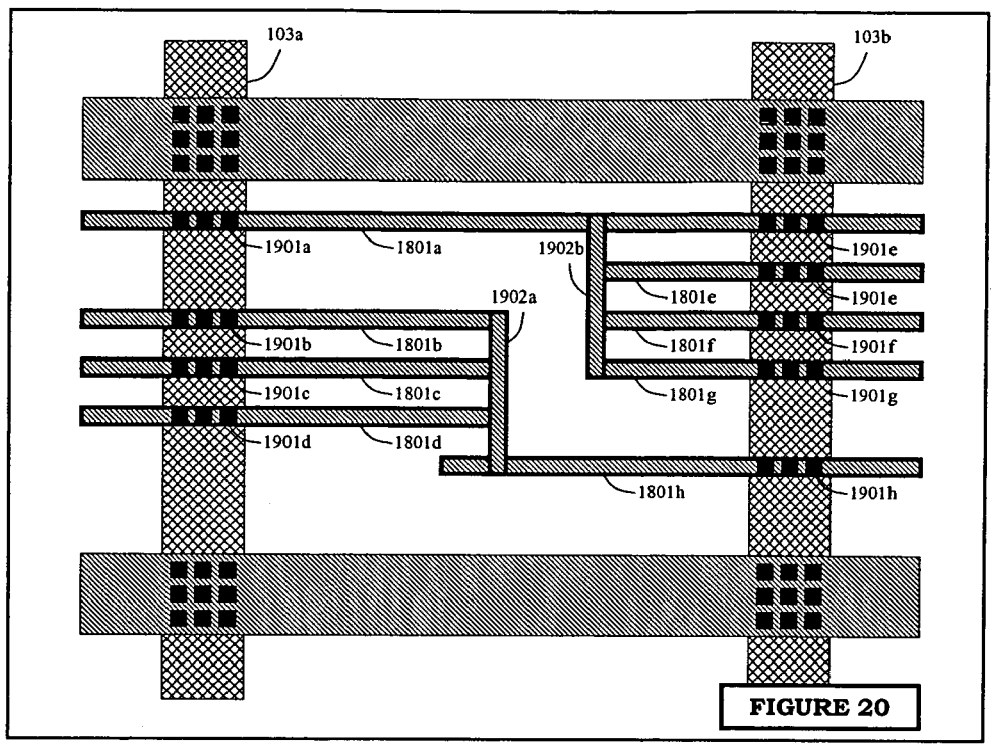

FIG. 20 illustrates the layout in FIG. 19 (M6 only), showing only mesh and metal fill geometries, and omitting signal routing.

Figure 21:
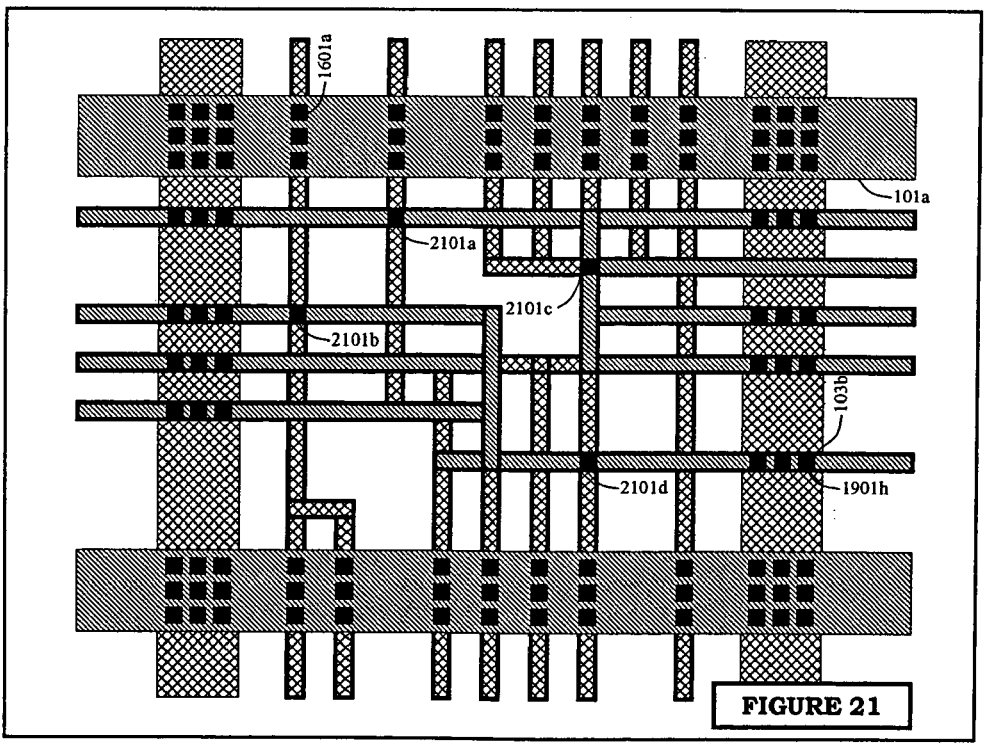

FIG. 21 illustrates the layout in FIG. 17 and FIG. 20 (both M5 and M6), showing only mesh and metal fill geometries, and omitting signal routing. The additional via connections between metal fill geometries on M5 and M6 are also shown.

FIGS. 22A to 22F illustrate a process of adding connections between metal fill geometries, according to an embodiment. In a preferred embodiment, only "loop-free" connections will be created.

Figure 22G:
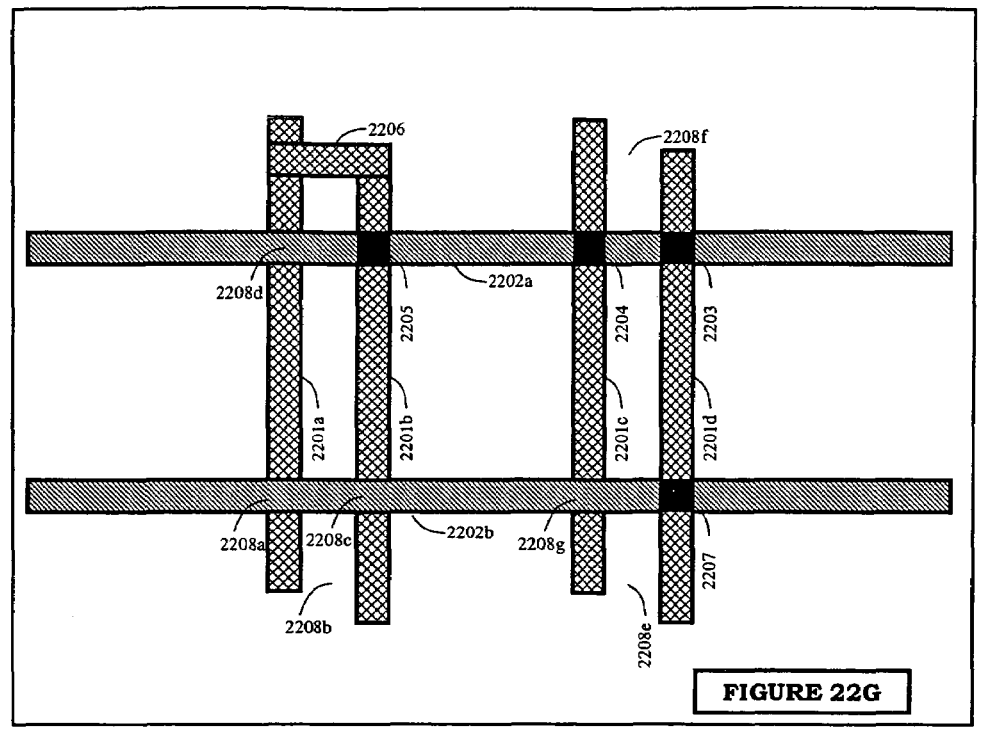

FIG. 22G illustrates the same layout as FIG. 22F, illustrating a maximally connected metal fill network without loop. No more connection between metal fill geometries can be made without creating a loop.

Figure 22H:
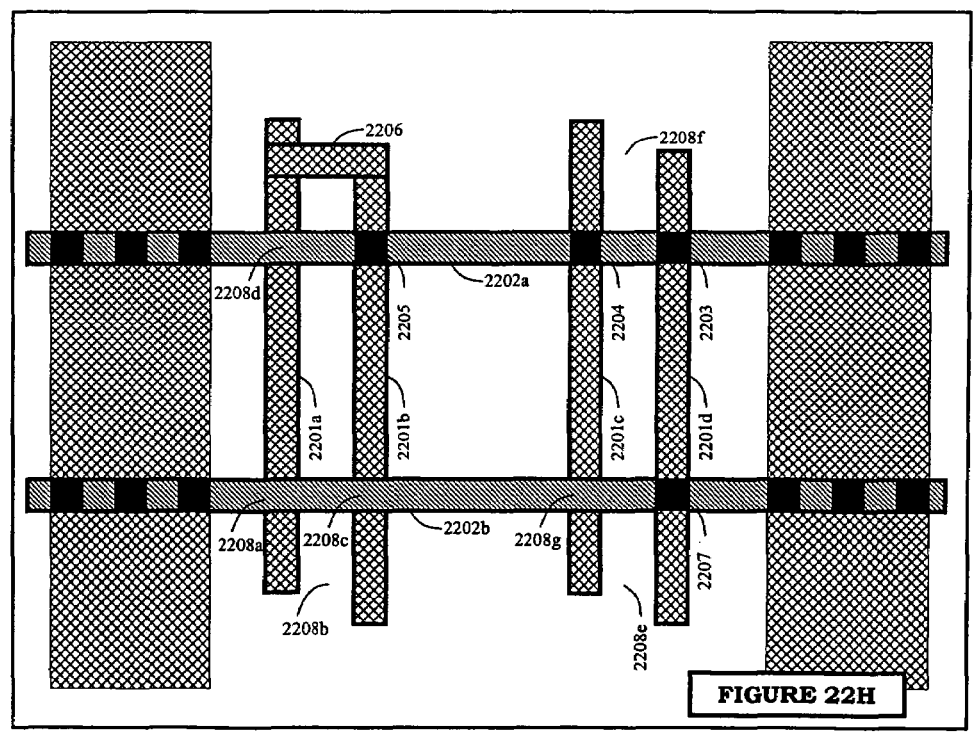

FIG. 22H illustrates the same layout as FIG. 22G, except that the connections between metal fill geometries and power mesh geometries are also shown.

Figure 23:
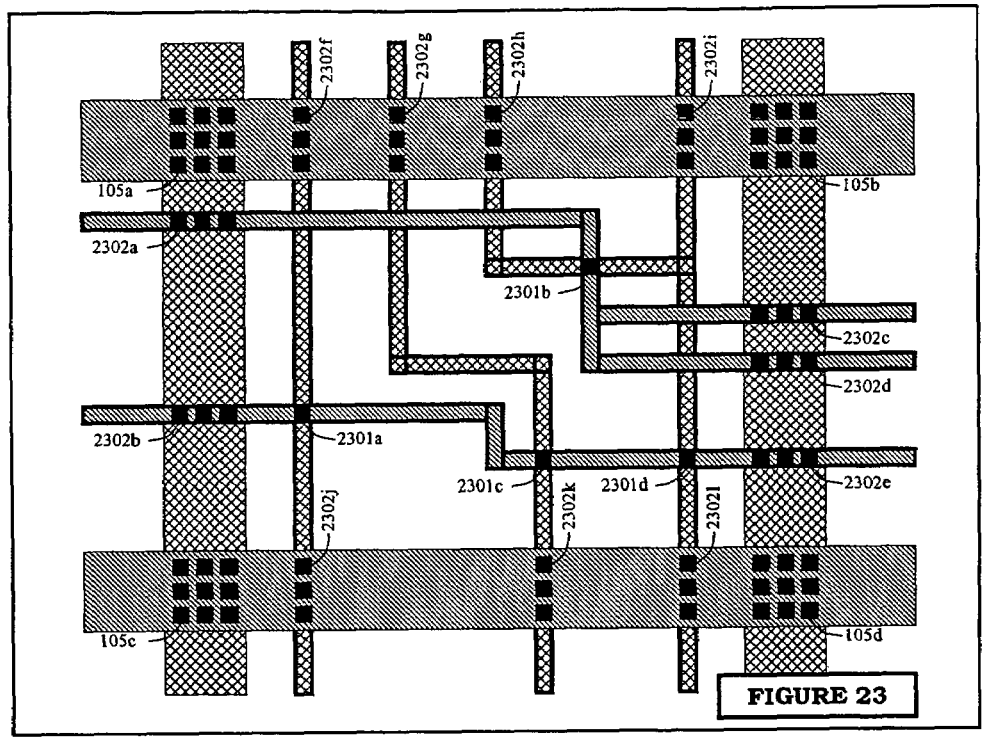

FIG. 23 illustrates a redundantly tied metal fill layout created using the preferred embodiment of the present invention.

Figure 24:
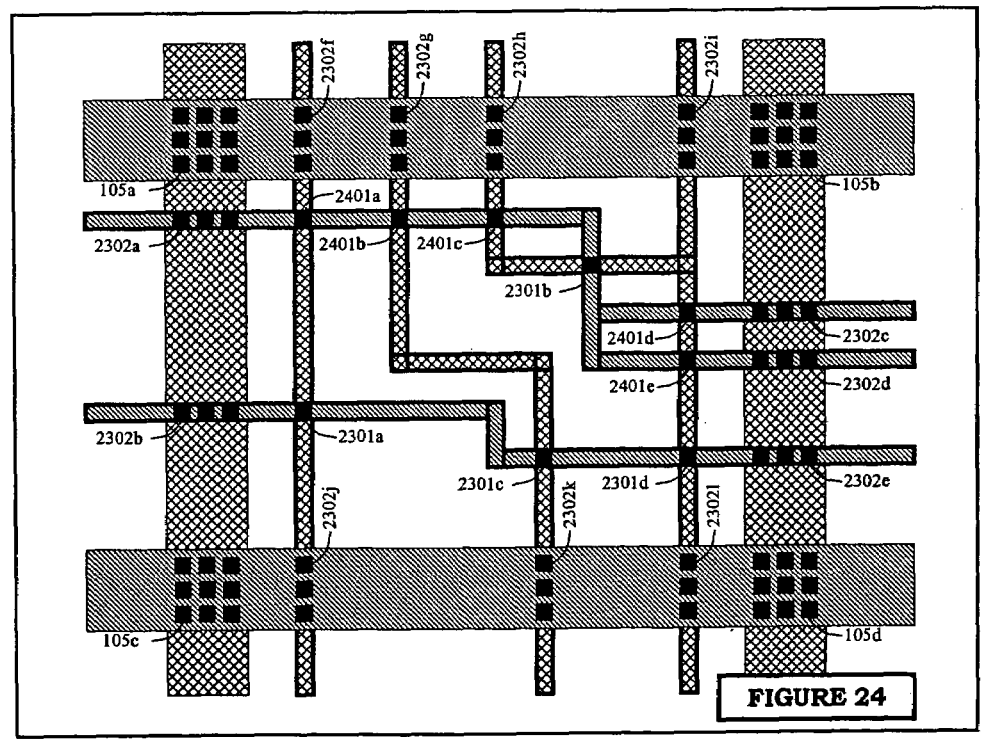

FIG. 24 illustrates a redundantly tied metal fill layout created using an alternative embodiment of the present invention, in which additional redundant connections are made to improve the robustness of the power structure compared to the baseline implementation in FIG. 23.

Figure 25:
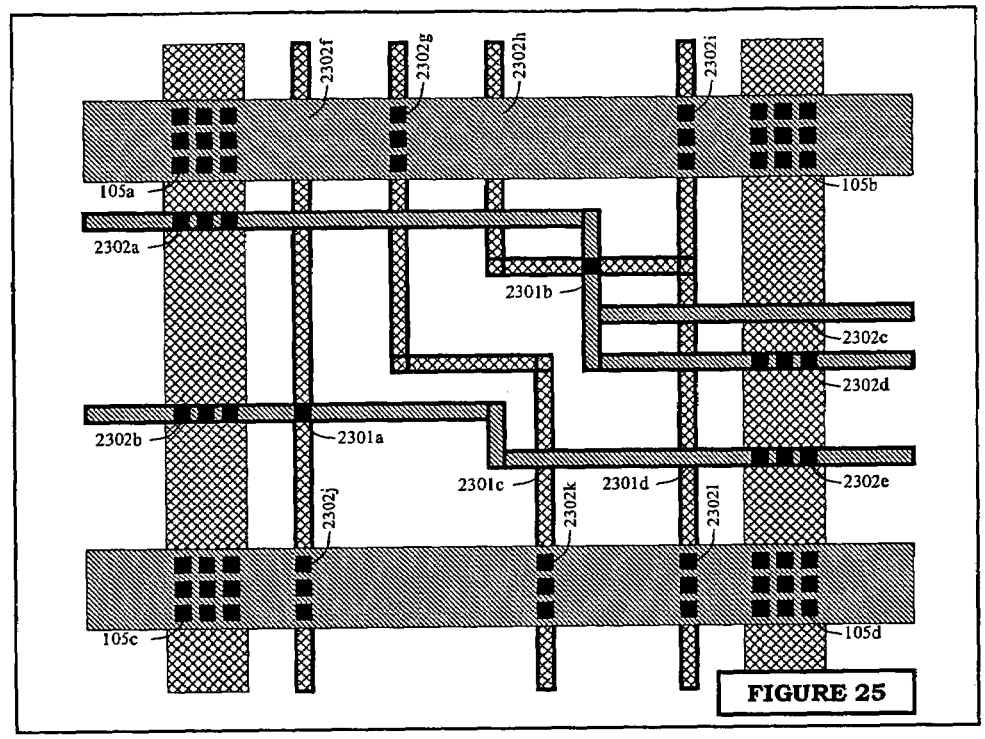

FIG. 25 illustrates a redundantly tied metal fill layout created using an alternative embodiment of the present invention, in which fewer redundant connections compared to the baseline implementation in FIG. 23.

Figure 26A:
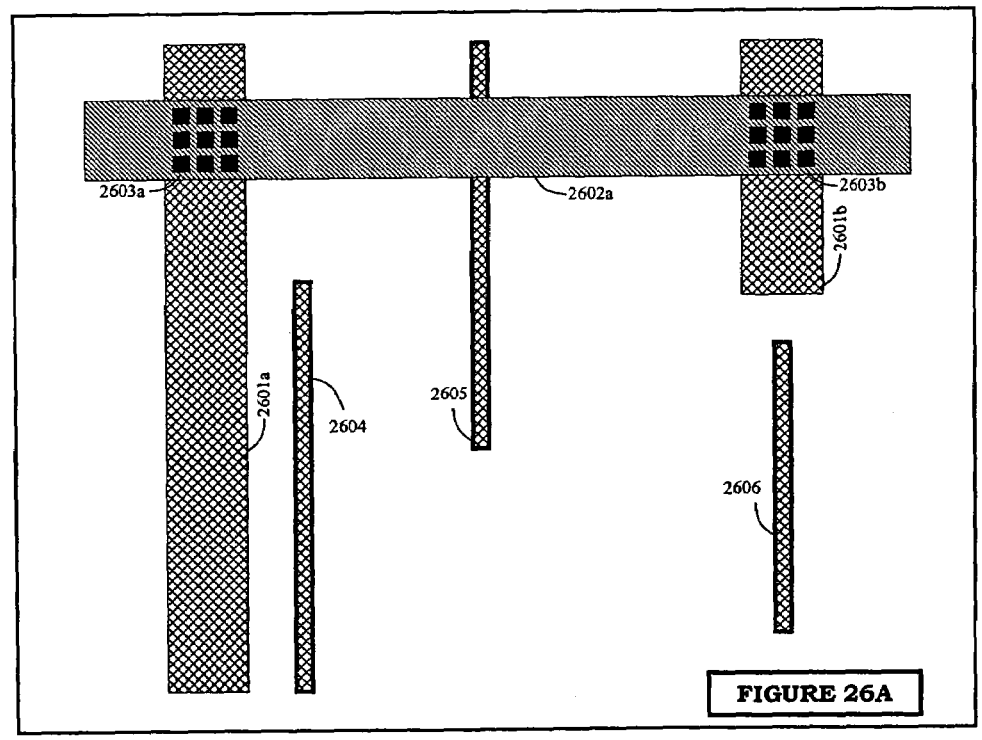
Figure 26B:
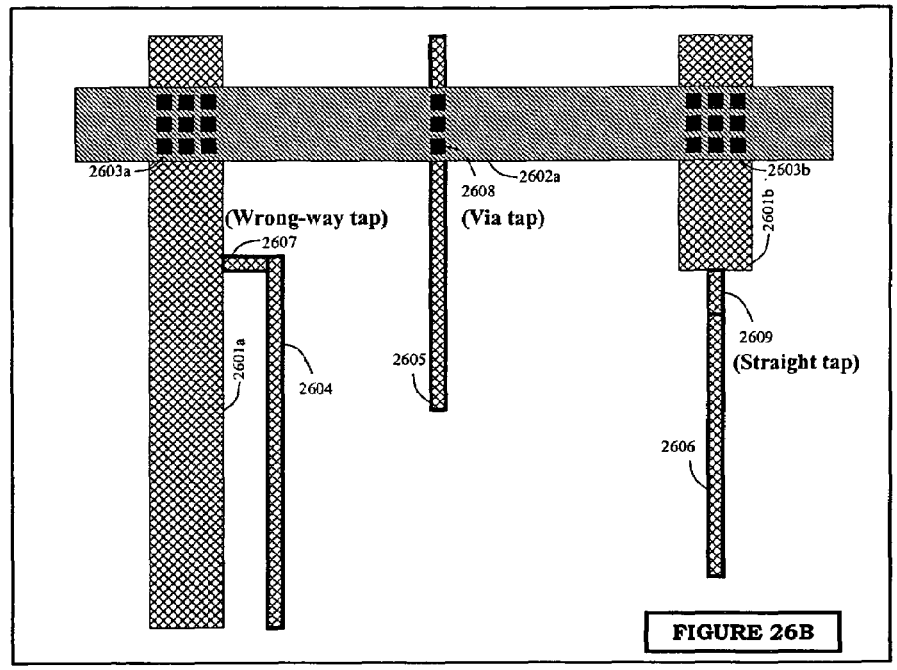

FIGS. 26A and 26B illustrate three different ways a metal fill can connect to the power mesh: (1) wrong-way tap, (2) via tap, and (3) straight tap.

Figure 27A:
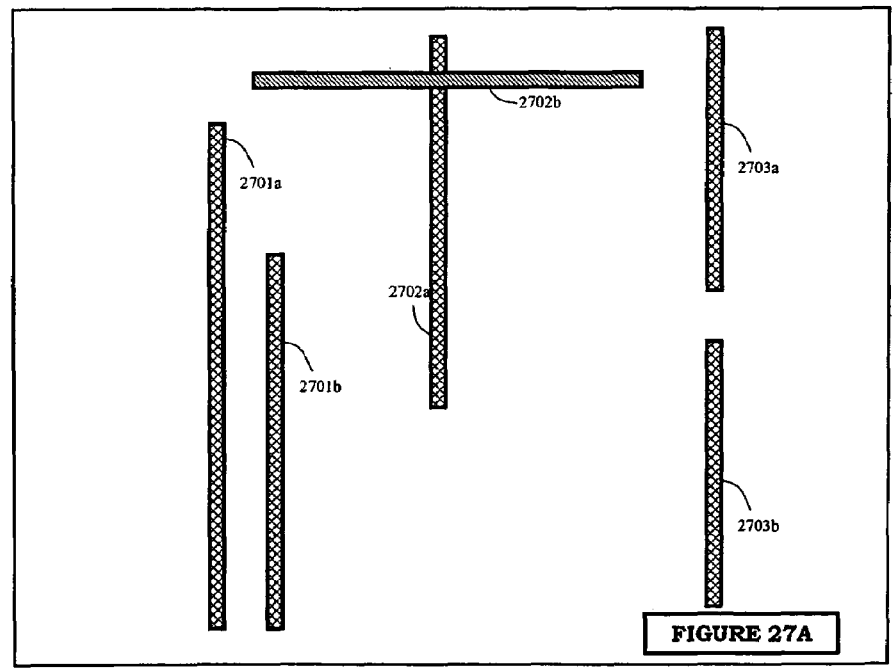
Figure 27B:
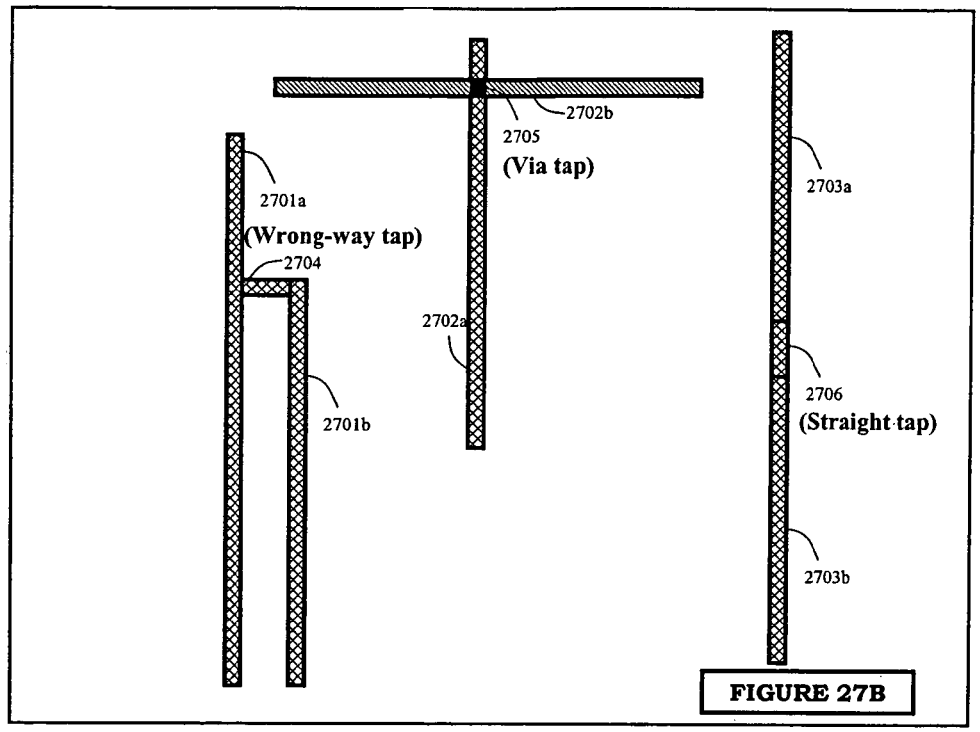

FIGS. 27A and 27B illustrate three different ways a metal fill can connect to a neighboring metal fill: (1) wrong-way tap, (2) via tap, and (3) straight tap.

Figure 28A:
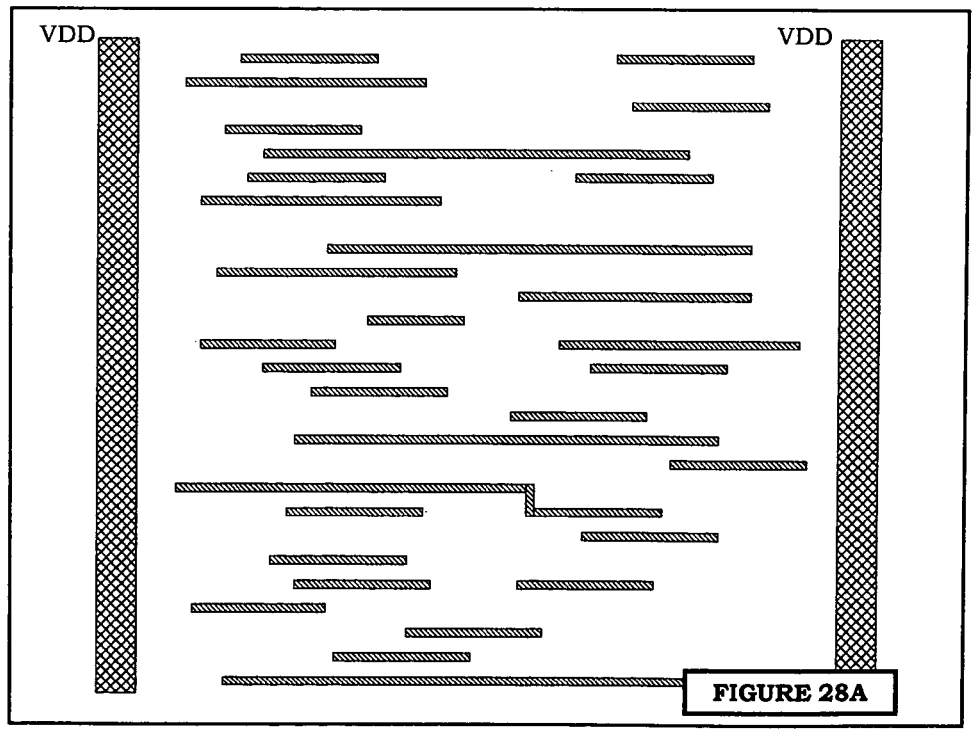

FIG. 28A illustrates a more realistic circuit than that in FIG. 3 in that the power meshes are much further apart.

FIG. 28B illustrates the layout in FIG. 28A after redundantly tied metal fill geometries are inserted.

FIG. 28C illustrates the layout in FIG. 28B, with the exception that appendices, or portion of the metal fill network not part of any path between power mesh geometries, are omitted. A majority of the redundantly tied metal fill network is not appendix.

Figure 28D:
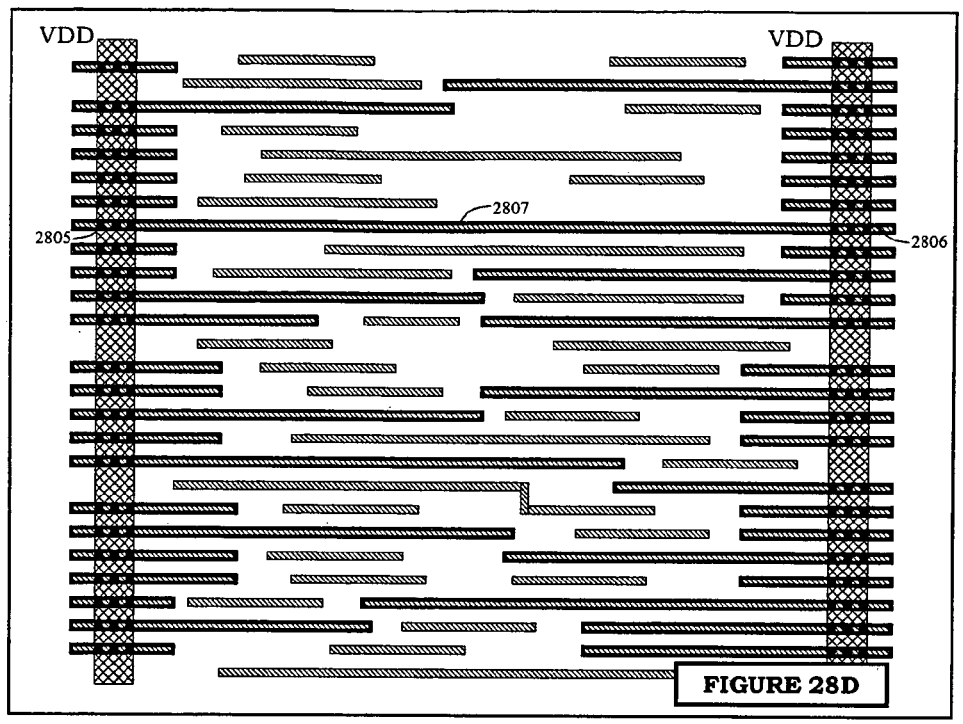

FIG. 28D illustrates the layout in FIG. 28A after the addition of conductive metal stripes described in prior art U.S. Pat. No. 6,305,000.

Figure 28E:
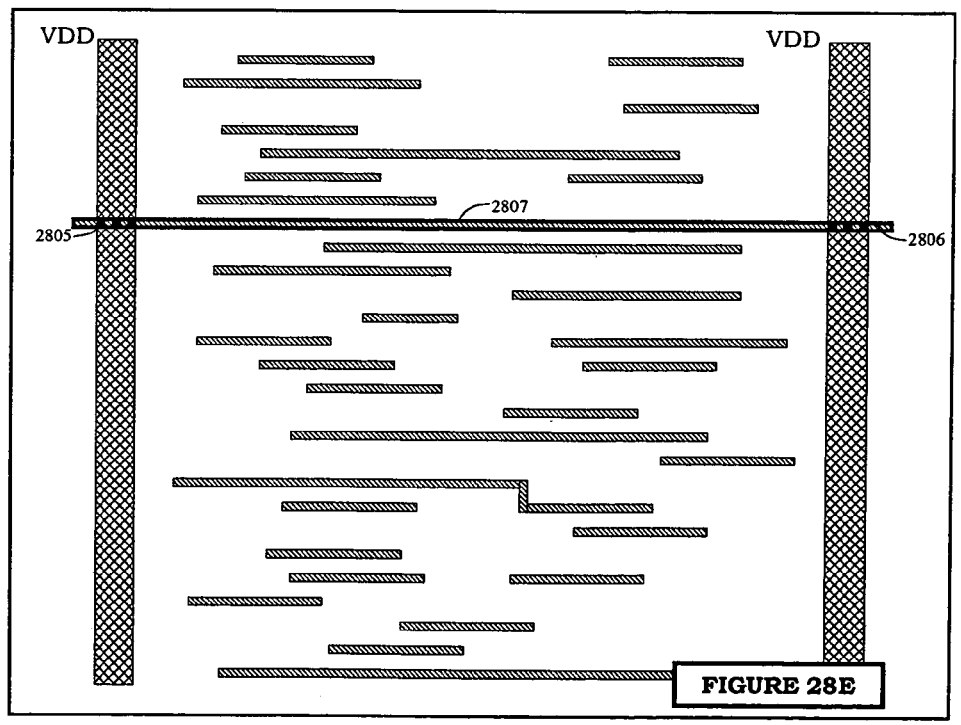

FIG. 28E illustrates the layout in FIG. 28D, with the exception that appendices are omitted. A majority of the conductive metal stripes are appendices because of the long distance between the power meshes.

Figure 29A:
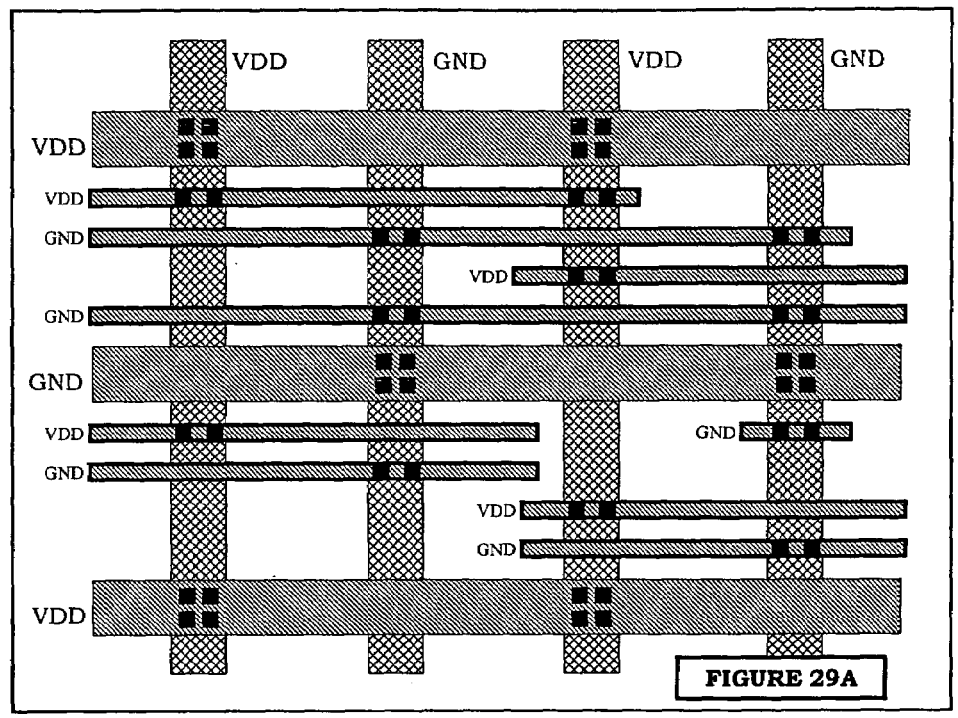
Figure 29B:
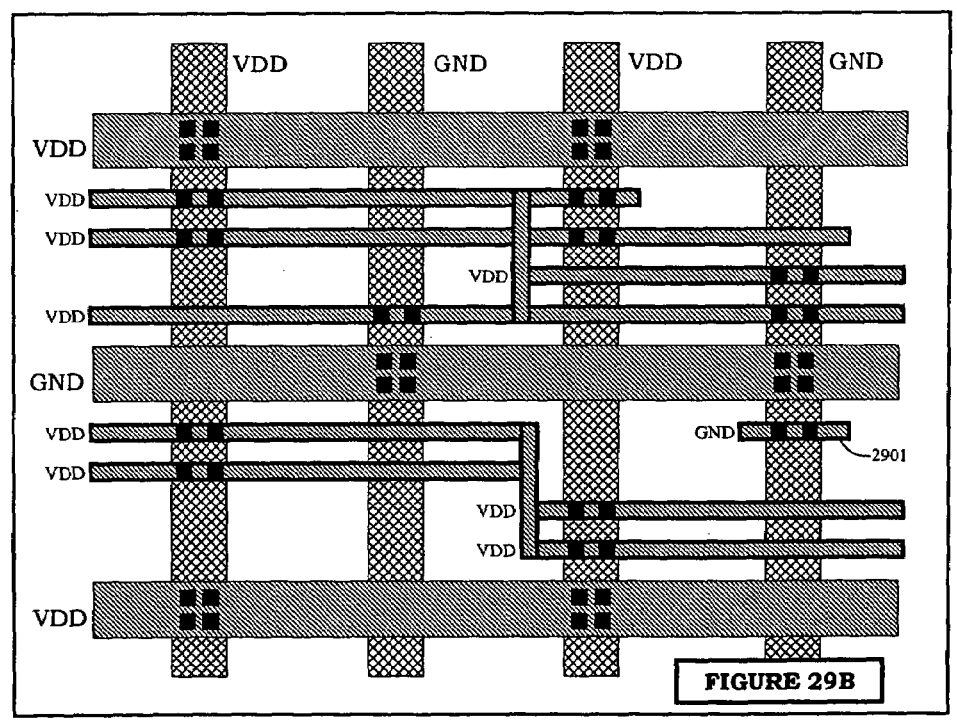

FIGS. 29A and 29B illustrate two alternative ways redundantly tied metal filling can be done when there are more than one power mesh. FIG. 29A has roughly equal number of redundant connections to VDD and to GND. FIG. 29B is dominated by VDD ties.

Figure 30A:
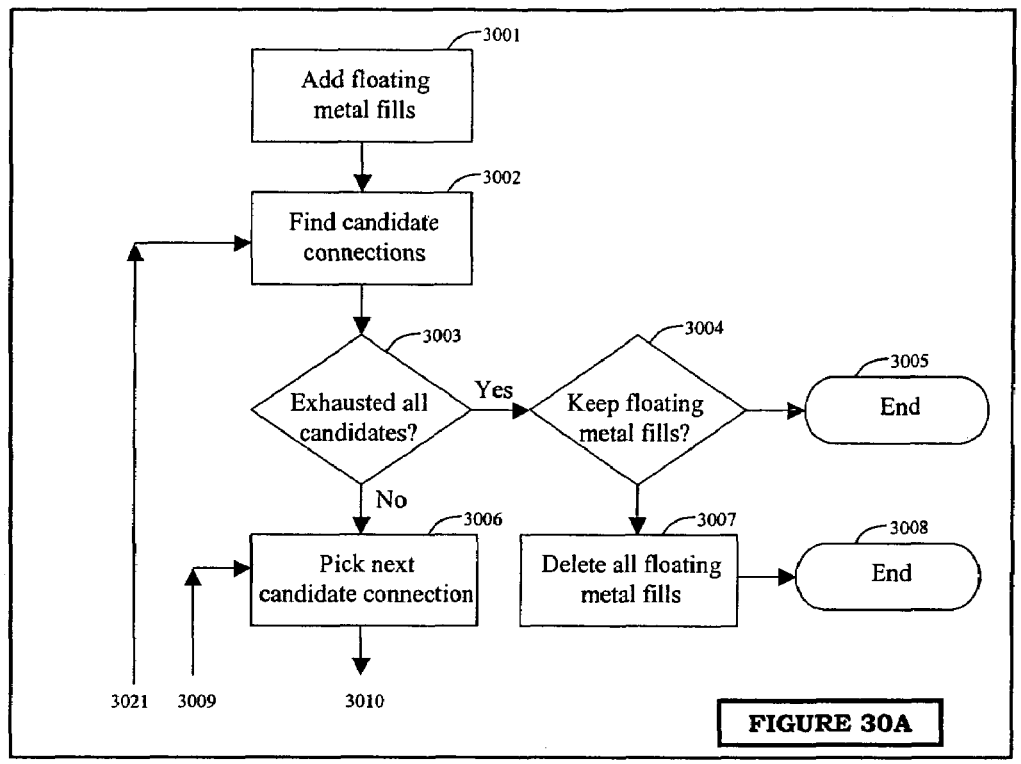
Figure 30B:
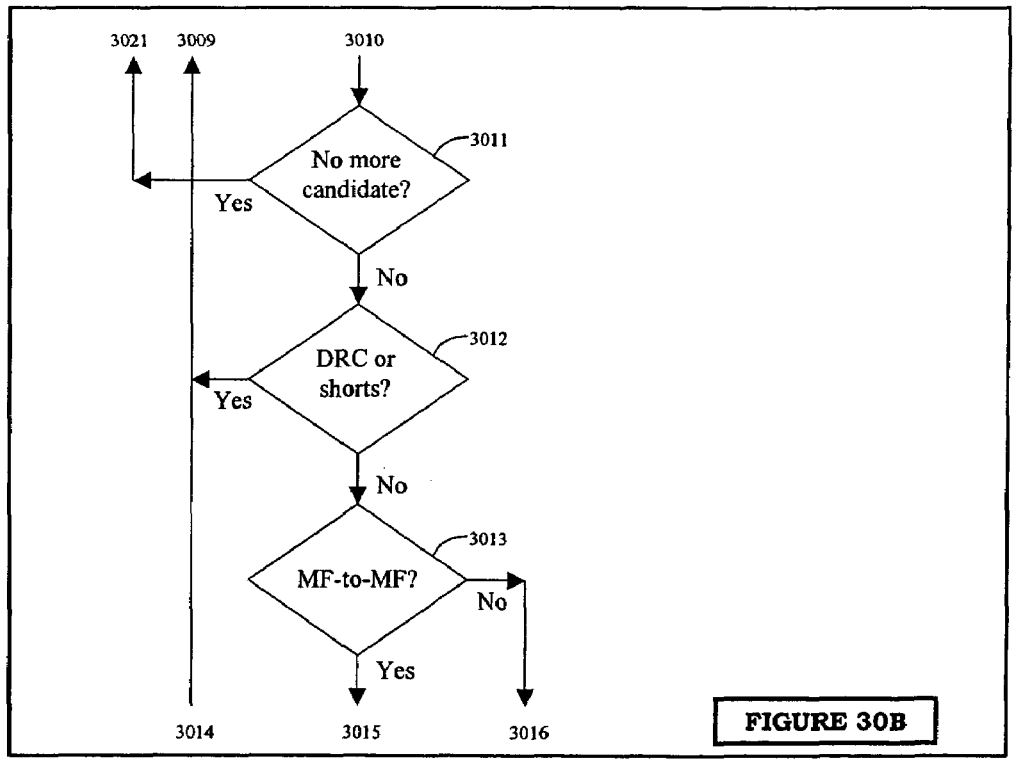

FIGS. 30A, 30B, and 30C describe a flow chart illustrating a method for redundantly tying metal fill geometries for IR-drop and metal density optimization.

FIG. 31A illustrates the IR-drop of an IC design after signal routing without redundantly tied metal fill.

FIG. 31B illustrates the metal density violation of the same IC design in FIG. 31A after signal routing without redundantly tied metal fill.

FIG. 32A illustrates the IR-drop of the same IC design as the one in FIG. 31A after redundantly tied metal fill.

FIG. 32B illustrates the metal density violation of the same IC design in FIG. 32A after redundantly tied metal fill.

DETAILED DESCRIPTION OF THE PREFERRED EMBODIMENTS

A preferred embodiment of the present invention is now described with reference to the figures where like reference numbers indicate identical or functionally similar elements and where depicted elements are not necessarily shown to scale. Also in the figures, the left most digit(s) of each reference number typically correspond(s) to the figure in which the reference number is first used.

Integrated devices are interconnected in electronic circuits with each other using metal layers in horizontal planes above the integrated devices. These metal layers (or levels), up to twelve or more, are referred to M1, M2, M3, etc. and facilitate signal routing and power distribution. The intermediate layers between metal layers are called via layers, and are referred to as V12, V23, V34, etc. For example, V12 is between M1 and M2. Those skilled in the art will recognize that power mesh conductors, signal conductors and fill metals described herein can be made of conductive material, for example, copper, titanium, aluminum, gold, tungsten or alloys thereof.

In IC design processes, various design rules are often employed to ensure proper design functionality and manufacturability, such as to provide uniform density in the layout or to meet signal integrity requirements. Minimum (and maximum) density rules on metal layers or via layers are followed to achieve uniform metal density requirements in the layout for Chemical-Mechanical Polishing (CMP), a process used to ensure uniform or near-uniform layer thickness. Copper technology is especially sensitive to manufacturing process variations because of its smaller size. The design rules of manufacturers require that all wiring levels on these electronic circuits have a minimum usage requirement; i.e., a minimum density of metal per area, across all portions of the circuit to achieve consistent metal distribution across a wafer to improve manufacturing yield and reliability.

The standard cells in IC designs are placed in rows where power rails (VDD, VSS) feeding the cells goes horizontally on the upper and lower side of the cells. To keep the IR drop under some certain levels and to conform to the electro-migration (EM) rules, a power mesh is routed above the standard cells which provides the standard cell VDD/VSS power rails (or supply voltages) with power, typically at equally distributed distance. The distance between each feed-point as well as the number of vias that must be dropped is dependent on the consumed power and the line width of the power rail. There are also alternatives concerning in which metal layers to route the power mesh. Usually two or more different metal layers (e.g., M2, M3) are used, at least one for the horizontal routing and at least one for the vertical routing of the power mesh. While specific examples of a typical IC power mesh structure are cited, the principle set forth herein are applicable to any power design methodology, including multiple power domains, voltage island, and other styles of power routing such as rings, fishbone, and so on.

An issue with conventional power mesh designs involves IR drop at certain locale of the power rail because of resistance in the wire. The IR drop will depend, among other factors, on the frequency of the mesh points and the width of each mesh on a power mesh layout. Thus, one way to reduce IR drop is to put in more power mesh geometries to reduce the effective resistance on the rail. Another way is to increase the width of the power mesh geometries. However, although these techniques will result in less voltage drop, it will also increase cost because the power mesh takes up more resources and hence may result in other undesirable effects such as routing congestion and increase in chip size.

Figure 1:
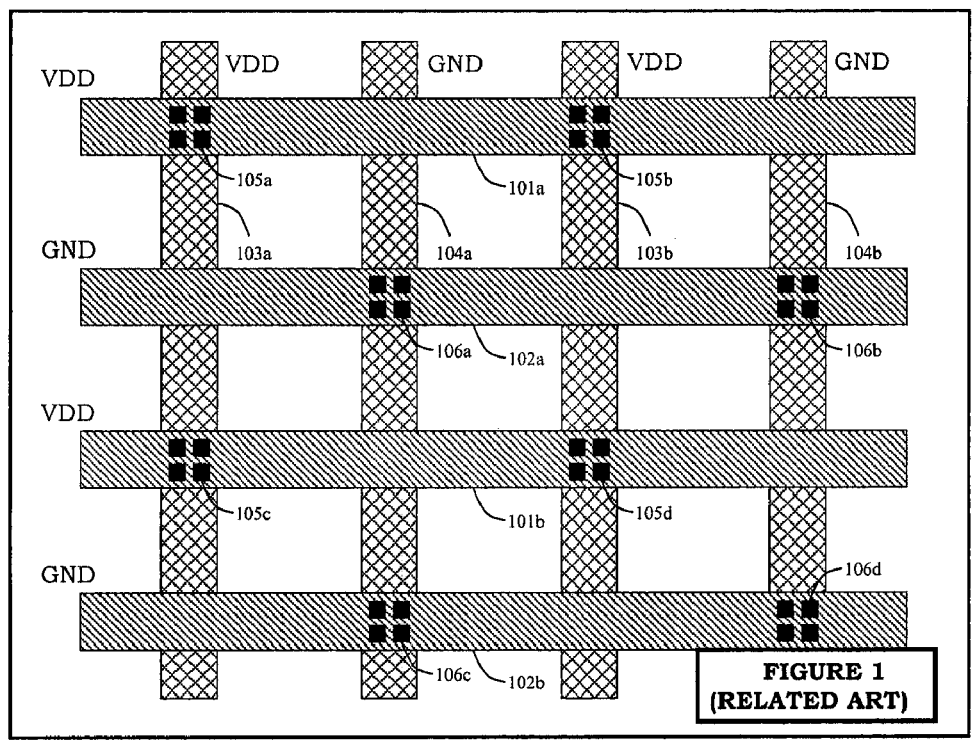
FIG. 1 is an illustration of a power structure of an integrated circuit with two metal layers (called M5 and M6), an intermediate via layer (V56). The power structure comprises one power (VDD) mesh and one ground (GND) mesh.

FIG. 1, shows a layout of an electronic circuit having two metal layers M5 and M6 positioned one above the other. It is noted that the discussion herein is with respect to these two metal layers, but the principle set forth herein are applicable to any number of metal layers, any number of power or ground nets, and any type of power network structures including meshes, rails, rings, and fish bones. Those of ordinary skill in the art will recognize that the drawings used to explain the principles are arbitrary and should be considered as illustrative only. The drawings are not intended to be limiting. In FIG. 1, metal layer M5 has power distribution and signal routing in which the power mesh comprises ground (GND) conductors 104*a* and 104*b*, bias voltage (VDD) conductors 103*a* and 103*b*. Another metal layer M6 lies in a plane above the first metal layer M5 with conductors running perpendicularly to those conductors in metal layer M5. Metal layer M6 shows power distribution comprising ground conductors 102*a* and 102*b*, and bias voltage conductors 101*a* and 101*b*. The conductors on M5 and M6 are connected to each other though interlevel conducting vias on the via layer V56, labeled 105*a* (connecting VDD conductor 103*a* on M5 and VDD conductor 101*a* on M6), 106*a* (connecting GND conductor 104*a* on M5 and GND conductor 102*a* on M6), and so on.

FIG. 2 shows an enlarged version of FIG. 1, showing only VDD conductors and vias. For the purpose of clarity, a small example with only VDD conductors is used, but the principles set forth herein are applicable to more general situations with multiple power nets. FIG. 2A shows the color scheme adopted throughout this disclosure to clearly distinguish between geometries of different types (power, signal, and metal fill) on different layers (M5, M6, and V56). In particular, geometries on M5 will be drawn with a checker pattern, and geometries on M6 will be drawn in a slanted (diagonal) pattern. Via geometries are drawn as black squares. Power mesh and signal routing geometries can be easily distinguished by their size, as power mesh geometries are much wider than signal routing geometries. Metal fill geometries are drawn with a thick black outline, and can easily be distinguished from power mesh or signal routing geometries.

FIG. 3 is the same as FIG. 2, except that signal routing wires and vias are added. In the example, three separate signal nets are routed in this region. The first net comprises wires 301*c*, 301*d*, and 301*e* on M5 only. The second net comprises of wires 302*a*, 302*b*, and 302*c* on M6 only. The third net comprises of wires 301*a* and 301*b* on M5, wires 304 on M6, and vias 303*a* and 303*b*. FIG. 3 shows only a small region of a layout. There may be other nets outside of this region that are not shown, and there may be other wires and vias belonging to these nets outside of this region that are not shown. FIG. 3 also shows empty regions between the power meshes of both the M5 and M6 layers and the signal routing. These empty regions violate the minimum area density requirement for metal, especially in sensitive copper technologies.

FIG. 4 shows the same region as FIG. 3 except that only M5 and V56 geometries are shown. FIG. 5 shows the same region as FIG. 3 except that only M6 and V56 geometries are shown. Since the process of metal fill introduces large number of geometries, it will be clearer to show the geometries on M5 and M6 separately.

Floating metal fill techniques are used to satisfy the metal density requirement for IC designs. Any floating metal fill techniques can be used in the present invention. One such technique is the sprinkle fill approach. FIG. 6 illustrates the layout of FIG. 4 showing M5 only; the empty regions in FIG. 4 are filled with small floating metal conductors labeled 601*a*, 601*b* . . . 601*o*. FIG. 7 illustrates the layout of FIG. 4 filled by another metal filling approach using long stripes of conductors labeled 701*a*, 701*b* . . . 701*g*. FIG. 8 illustrates yet another metal filling approach using a combination of thin stripes of conductors labeled 802*a*, 802*b*, and 802*c*, and fat square conductors 801*a*, 801*b* . . . 801*o*.

One problem with these metal filling approaches illustrated in FIGS. 6, 7, and 8 is that the metal fill geometries are floating, i.e., they are not electrically connected to either the power distribution networks or the signal routing geometries. Unexpected line-to-line coupling and vertical coupling between metal planes result from the use of the floating metal fill geometries and cause unpredictable electrical and performance problem. In many cases, IC designers solve this problem by tying the floating metal fill geometries to ground, as illustrated in FIG. 9. FIG. 9 illustrates the same layout as FIG. 7, including the power mesh and signal routing. However, the stripes of one or more metal fill geometries added 901a, 901b . . . 901l, are connected to the power mesh through the addition of via geometries, labeled 902a, 902b . . . 902l. Hence, the metal fill conductors 901a, 901b . . . 901l are not floating, but instead assumes the same voltage as the power or ground conductor they connect to. FIG. 10 illustrates the same figure as FIG. 9 except that signal geometries are not drawn. This clearly illustrates that the tied metal fill geometries are like appendices or tree branches hanging from the power mesh. In other words, the tied metal fill geometries are "dead ends", not part of any simple path between any pairs of power mesh geometries.

Similarly, FIG. 11 illustrates the same layout as FIG. 5, including the power mesh and signal routing. However, the stripes of metal fill geometries added, labeled 1101a, 1101b . . . 1101h, are connected to the power mesh through the addition of via geometries, labeled 1102a, 1102b . . . 1102h. FIG. 12 illustrates the same figure as FIG. 9 except that signal geometries are not drawn. Again, the tied metal fill geometries are "dead ends", not part of any simple path between any pairs of power mesh geometries.

While tied metal fill solves the problem with the unpredictable electrical and performance problem resulting from the use of the floating metal fill geometries, tied metal fill geometries have no impact on the IR-drop characteristic of the power mesh structure. Despite attaching a large number of tied metal fill geometries to the power mesh structure, these tied metal fill geometries do not help reduce the effective resistance of the power network. Tied metal fill geometries is usually done in two steps. First, floating metals are added. Then floating metals are iteratively connected to the VDD power mesh, the GND power mesh, or other metal fill geometries that are already tied to VDD or GND. Once the connection is made, the metal fill is no longer floating, and no further connection will be made. In other words, tied metal filling is done in an irredundant fashion. That is, metal fill geometries are connected to power mesh whenever possible, but no unnecessary connections are made. As an immediate consequence of the irredundancy, these tied metal fill geometries are appendix-like.

One of the reasons metal fill geometries are tied to power and ground in an irredundant fashion is to minimize the number of geometries introduced by tied metal fill geometries. If metal fill geometries are tied to power and ground and to each other whenever possible, the total number of geometries introduced can be substantial, often exceeding what typical electronic design automation systems can handle. For example, a circuit with one million placeable objects may contain 20 million geometries. Adding floating metal fill geometries may increase the number of geometries to 40 million, a two-fold increase. Furthermore, tying the floating metal fill geometries to power and ground may increase the total geometry count to 60 million, even if the connection is done in an irredundant fashion. If the metal fill geometries are connected to power mesh geometries and other metal fill geometries in a maximally redundant fashion, i.e. whenever possible, the final number of geometries created may approach or exceed 100 trillion. The large number of geometries introduced exceeds the capacity of conventional metal fill software implementation.

As a result of the conventional approaches of tying metal fill geometries irredundantly (to minimize the number of geometries introduced), the IR-drop characteristic of the power mesh stays unaltered. Even though there are metal fill geometries attached to the power mesh, current does not flow through the metal fill geometries because they behave like an appendix branching off from the main power mesh. One of ordinary skill in the art will concur with the observation that it is desirable to reduce effective circuit resistance and impedance of the paths from the power source to the locations with IR-drop problems. The irredundantly tied metal fill geometries will not reduce the resistance, and hence, has no impact on IR-drop.

An exception to the irredundancy in tying metal fill geometries is described in U.S. Pat. No. 6,305,000. In that disclosure, conductive metal stripes are first added to each layer in a design-rule correct fashion to satisfy metal density, following the preferred direction of each routing layer. These metal fill geometries are then connected to power mesh on the adjacent layers using vias whenever possible, while ensuring that there is no short-circuit between different power nets. For example, once a conductive metal stripe connects to VDD, the same metal stripe will not be connected to GND even if the metal stripe runs over a GND mesh geometry on the adjacent layer. FIG. 13 illustrates the result of the addition of conductive metal stripes and subsequent connection of the conductive metal stripes to the region in FIG. 3 as described in the U.S. Pat. No. 6,305,000. For clarity purpose, all tied metal fill geometries that are appendix-like and do not affect the IR-drop behavior are removed from the drawing in FIG. 13. In FIG. 13, conductive metal stripe 1301a on M5 is connected to the VDD mesh geometries 101a and 101b on M6 using vias 1303a and 1303c respectively. Similarly, conductive metal stripe 1301b on M5 is connected to the VDD mesh geometries 101a and 101b on M6 using vias 1303b and 1303d. Finally, metal stripe 1302a on M6 is connected to the VDD mesh geometries 103a and 103b on M5 using vias 1304a and 1304b respectively. FIG. 14 illustrates the same layout as FIG. 13 except that only power mesh and metal fill geometries are shown.

It is noted that the metal stripes run in a preferred direction of the routing layer, and these metal stripes are not directly connected to each other. While the remaining conductive metal stripes that are tied to power mesh at multiple locations help improve the robustness of the power structure for IR-drop, the extent of the improvement depends heavily on whether perfectly straight metal stripes can be inserted and tied to the same power mesh at multiple locations. Moreover, if the power meshes are far apart, the chance of successfully tying metal stripes to the power meshes is significantly reduced.

Embodiments of the present invention present a robust approach to simultaneously (1) reduce metal density violations by adding tied metal fill geometries, and (2) reduce EM violations by improving the IR-drop robustness of the power mesh by introducing large number of additional conducting paths between power mesh geometries. The embodiments achieve both (1) and (2) without introducing excessive number of metal fill geometries. Further, the embodiments are robust in that metal fill geometries are not only redundantly connected to the power mesh geometries, but are connected to each other using both vias and wires in a way that boosts connectivity.

It is noted that the metal density rules and EM rules are unrelated. Nevertheless, metal fill geometries are advantageously used to satisfy both the metal density requirements and the IR drop requirements while adhering to the appropriate design rules. Moreover, the circuit generated satisfies both of these metal density and IR-drop requirements (and design rules) by using a partial redundancy design.

The term "redundancy", as used herein to describe certain connections, is described below in further detail. A connection between two groups of objects is "irredundant" if the removal of such connection disconnects the two said groups of objects from each other. Equivalently, if a connection between two groups of objects is irredundant, all paths between the two said groups must go through this connection.

By the same token, a connection is "redundant" if the removal of such connection does not disconnect the two said groups of objects from each other. Equivalently, if a connection between two groups of objects is redundant, there exist one or more paths between the two said groups of objects that do not go through the said redundant connection.

In traditional tied metal fill approaches, metal fills are connected to power meshes in an irredundant fashion. Hence, the removal of any such connections will electrically disconnect the metal fills from the power mesh geometries. This also implies that the metal fill geometries do not form any additional pathway between the power mesh geometries.

In the present invention, the system and method makes redundant connection between metal fill geometries and power mesh geometries, and between metal fill geometries and other metal fill geometries. For example, multiple connections between a group of electrically-connected metal fill geometries and a group of electrically-connected power mesh geometries are made. Hence, there exist multiple pathways from a given metal fill geometry to the power mesh geometries. Equivalently, the metal fill geometries establish additional pathways between the power mesh geometries.

The system and method disclosed herein further distinguishes between "maximal" redundancy and "partial" redundancy between two groups of objects (or among the same group of objects). In maximal redundancy, whenever there is a legal candidate connection between two objects in the two groups, the connection will be made. In partial redundancy, whenever there is a legal candidate connection between two objects in the two groups, the connection may or may not be made, depending on the criteria for making the connection. Hence, if the connectivity is partial, some candidate connections may be intentionally dropped, whereas no candidate connections are dropped in the case of maximal connectivity.

FIG. 21 illustrates a preferred embodiment of the present invention, which selectively adds redundant connections between metal fill geometries and power mesh geometries, and between metal fill geometries and other metal fill geometries. For the purpose of illustration, the process is first shown on M5 (FIGS. 15, 16, and 17), then on M6 (FIGS. 18, 19, and 20). The final result is shown in FIG. 21. In practice, however, the system performs redundantly tied metal filling on all layers simultaneously.

FIG. 15 shows the same layout as FIG. 3 and FIG. 4 (showing M5 only), except that floating metal fill geometries on M5 are added, labeled 1501a, 501b . . . 1501l. Then, these metal fill geometries are tied to the power mesh geometries using vias and wires, and connect to each other using vias and wires, as illustrated in FIG. 16.

FIG. 16 is the same as FIG. 15, except that one or more array vias 1601a, 1601b. . . 1601n are added to connect the metal fill geometries to the power mesh geometries 101a and 101b. Note, for example, that metal fill geometry 1501a connects to the power mesh geometries 101a and 101b by vias 1601a and 1601h, respectively. Furthermore, some (but not all) metal fill geometries on the same layers are connected to each other by introducing new metal fill geometries that run in the non-preferred direction of the layer. For example, in FIG. 16, metal fill geometry 1602a is added to physically connect existing one or more metal fill geometries 1501d, 501e . . . 1501g. Similarly, metal fill geometry 1602b is added to physically connect one or more existing metal fill geometries 1501h, 1501i . . . 1501l. These additional metal fill geometries introduce redundancy in the network of metal fill geometries, because their addition does not necessarily result in the connection of two components previously not electrically connected. Nonetheless, the addition of these geometries allows more conductive paths between different locations of the power mesh. For example, in FIG. 16, there is a path from the location of the M6 mesh geometry under via 1601b to the location of the M6 mesh under via 1601m. This path goes through the metal fill geometries 1501c, 1602b, and 1501g, forming an auxiliary and supplemental connection between different power mesh geometries.

FIG. 17 is the same as FIG. 16 except that signal geometries are not shown. FIG. 17 clearly shows that the redundantly tied metal fill geometries supplements the existing power mesh, making it more robust and less prone to IR-drop problem. At the same time, these metal fill geometries help satisfy metal density violations in the same fashion as would traditional tied metal filling approaches.

Thus, FIGS. 15, 16, and 17 illustrate an example in which redundantly tied metal fill geometries can be used to introduce new conducting paths between power mesh geometries, hence, improving the IR-drop robustness of the power network. Similarly FIGS. 18, 19, and 20 illustrate an example of redundantly tied metal fill on M6. In particular, FIG. 18 shows the same layout as FIG. 3 and FIG. 5 (showing M6 only), except that one or more floating metal fill geometries on M6 are added (labeled 1801a, 1801b . . . 1801h). Then, these metal fill geometries are tied to the power mesh geometries using vias and wires, and connect to each other using vias and wires, as illustrated in FIG. 19. FIG. 19 is the same as FIG. 18, except that one or more array vias 1901a, 1901b . . . . 1901i are added to the metal fill geometries to the power mesh geometries 103a and 103b. Furthermore, some (but not all) metal fill geometries on the same layers are connected to each other by introducing new metal fill geometries that run in the non-preferred direction of the layer. For example, in FIG. 19, metal fill geometry 1902a is added to physically connect existing metal fill geometries 1802b, 1802c, 1802d, and 1802h. Similarly, metal fill geometry 1902b is added to physically connect existing metal fill geometries 1801a, 1801e, 1801f, and 1801g. The addition of these redundant metal fill geometries allows more conductive paths between different parts of the power mesh. For example, in FIG. 19, there is a path from the location of the M5 mesh geometry under via 1901b to the location of the M5 mesh under via 1901i. This path goes through the metal fill geometries 1801b, 1902a, and 1801h, forming an auxiliary and supplemental connection between different power mesh geometries.

FIG. 20 is the same as FIG. 19 except that signal geometries are omitted to clearly illustrate how the redundantly tied metal fill geometries supplement the existing power mesh.

Finally, FIG. 21 illustrates the combination of FIG. 17 (redundantly tied metal fill geometries on M5 only) and FIG. 20 (redundantly tied metal fill geometries on M6 only), showing both M5 and M6 tied metal fill geometries, as well as the power mesh geometries. It is noted that while the two layers M5 and M6 are illustrated separately, it was done so for the purpose of illustration only. The actual process of adding redundantly tied metal fill geometries can be applied one layer at a time, or all layers at the same time.

In addition to metal fill geometries added in FIG. 17 and FIG. 20, metal fill vias may also be added to introduce redundant connectivity to the metal fill network, as illustrated in FIG. 21. In particular, vias 2101a, 2101b, 2101c, and 2101d are metal fill vias added to establish additional connectivity between different points in the power mesh. For example, there now exists a path from the M6 power mesh at via 1601a to the M5 power mesh at via 1901h through via 2101b.

In the following, a few specific choices and alternative implementations are presented to provide more insight on how the invention advantageously uses redundancy to satisfy metal-density requirements and to improve IR-drop robustness of the power mesh design without introducing an excessive number of metal fill geometries. While particular embodiments and applications of the present invention have been illustrated and described, it is to be understood that these embodiments are not limited to the precise construction and components disclosed herein and that various modifications, changes and variations, which will be apparent to those skilled in the art, may be made in the arrangement, operation and details of the method and apparatus of the present invention disclosed herein without departing from the spirit and scope of the invention as defined in the appended claims.

In circuit design, it is desirable to use the minimal connections necessary in order to reduce the number of geometries for the layers. Hence, while it is desirable to add redundancy to the tying of metal fill geometries to the power and ground mesh structures, the redundancy must be added in a way that avoids the introduction of an excessive number of new geometries. As explained previously, if metal fill geometries are tied to each other at maximum redundancy, i.e., adjacent metal fill geometries are tied together whenever possible without violating design rules and electrical rules, the number of geometries introduced can increase by a very large factor (in the thousands or millions).

In an embodiment of the present invention, maximum redundant connections are used to connect metal fill geometries to the power mesh geometries. However, redundant metal fill to metal fill connections are minimized. In particular, in this embodiment, redundant metal fill connections are added between existing metal fill geometries only if the addition of the connecting metal fill geometry does not introduce a loop among metal fill geometries (considering only metal fill geometries and ignoring power mesh geometries). This is illustrated in FIGS. 22A to 22F. This decision process is key to achieving sufficient redundancy among metal fill geometries while minimizing the total number of metal fill geometries introduced.

FIG. 22A illustrates a simple example with four metal fill geometries on M5 labeled 2201a, 2201b, 2201c, and 2201d, and two metal fill geometries on M6 labeled 2202a and 2202b. In FIG. 22A, no two metal fill geometries are directly connected to each other, considering only metal fill geometries and ignoring power mesh geometries. As long as two adjacent metal fill geometries are not already connected, a connection can be added between them. This is illustrated in FIGS. 22B to 22E, as the system iteratively adds redundant connection between two adjacent metal fill geometries either on the same layer or adjacent layers. In FIG. 22B, metal fill via 2203 is added to connect metal fill geometries 2201d on M5 and 2202a on M6. In FIG. 22C, metal fill via 2204 is added to connect metal fill geometries 2201c on M5 and 2202a on M6. In FIG. 22D, metal fill via 2205 is added to connect metal fill geometries 2201b on M5 and 2202a on M6. In FIG. 22E, metal fill geometry 2206 on M5 is added to connect metal fill geometries 2201a and 2201b on M5. Finally, in FIG. 22D, metal fill via 2207 is added to connect metal fill geometries 2201d on M5 and 2202b on M6.

As additional metal fill geometries are added to connect the existing metal fill geometries together, the system monitors whether two metal fill geometries should be connected together. As in the case of traditional tied metal fill described previously, the system makes a connection between two metal fill geometries if the connection (1) does not result in a design-rule violation, and (2) does not result in a short between different power nets. In additional, and more importantly, to minimize the number of metal fill geometries created, an additional "loop-free" condition is required, (3) that there does not already exist a physical path involving only metal-fill geometries between the two said metal fill geometries. If the last condition is satisfied, the system determines there is no loop involving only metal-fill geometries between any two metal fill geometries.

FIG. 22G illustrates how the loop-free condition is tested. FIG. 22G is an enlarged version of FIG. 22F as described above. While there are still a lot of candidate connections between adjacent metal fill geometries, namely candidates at locations 2208a, 2208b . . . 2208g, all of them fail the loop-free condition. For example, if a bridge (same-layer) metal fill geometry is added to location 2208b to connect metal fill geometries 2201a and 2201b on M5, a loop will be formed because there is already a path from 2201a to 2201b through 2206 on M5. Similarly, if a metal fill via is added to location 2208g to connect metal fill geometries 2201c on M5 and 2202b on M6, a loop will be formed because there is already a path from 2201c to 2202b through via 2204, 2202a on M6, via 2203, 2201d on M5, via 2007, and finally to 2202b.

One of ordinary skill in the art will recognize that the "loop-free" test—same as the test of whether there already exist a metal-fill-only path between two existing metal fill geometries—can be queried very efficiently using a well-known data structure called "Union-Find" as described in all intermediate-level Computer Science textbooks on data structures and algorithms, such as "Algorithm" by Cormen, Leisersen, and Rivest (MIT Press), which is incorporated herein by reference. "Union-Find" allows for near-constant-time implementation of operations called "Union-Set" (to put the elements of two sets into one) and "Same-Set" (to test whether two elements are in the same set). A set represents a collection of metal fill geometries that are physically connected together (and hence a path exists between any two members in the same set). Initially, each metal fill geometry is represented by a set with a single member, hence no path between any two metal fill geometries yet. Before connecting two metal fill geometries together, the system performs the "Same-Set" operation to test whether the two metal fill geometries are already in the same set. If the answer is affirmative, the connection is rejected to avoid the creation of a loop. If the answer is negative, the metal fill bridge (same-layer) or via geometry will be created, connecting the two previously unconnected metal fill geometries. Then, the two sets will be combined together using the "Union-Set" operation.

Likewise, one of ordinary skill in the art will also recognize that the "loop-free" condition guarantees that the maximum number of connections made between metal fill geometries is no more than the initial number of metal fill geometries. Let N be the total number of metal fill geometries initially (N is also the number of sets initially). Each bridge or via geometry added will reduce the number of sets by one (the "Union-Set" operation reduces the number of sets by one). Hence, the maximum number of new bridge or via geometries created is N−1, because the final number of sets must be at least one. This is an important property that helps control the total number of redundantly tied metal fill geometries introduced.

An embodiment the system may seek to add redundancy without introducing an excessive number of additional metal fill geometries. While it is emphasized that minimization of additional metal fill geometries is desirable, the approach in a preferred embodiment does not preclude in any way the possibility of adding extra redundancy between metal fill geometries. Extra loops and redundancy may be desirable in regions where IR-drop is severe and maximum redundancy will help improve the voltage drop. This may also be desirable in regions where minimum via density rules are violated but can be fixed by adding vias. FIG. 23 illustrates a circuit similar to that in FIG. 21, except that the number of metal fill geometries is reduced to simplify the discussion. No signal routing geometries are shown for clarity. In FIG. 23, there are vias connecting metal fill to power mesh geometries, labeled 2302a, 2302b . . . 2302l. There are vias connected metal fill to metal fill geometries, labeled 2301a, 2301b, 2301c, and 2301d. The redundantly tied metal fill depicted in FIG. 23 is obtained using an embodiment with maximum redundancy between metal fill and power mesh geometries, and partial redundancy (satisfying the "loop-free" test) between metal fill geometries.

FIG. 24 illustrates the same circuit as FIG. 23, except that vias labeled 2401a, 2401b . . . 2401e are introduced to maximize redundancy among metal fill geometries. In other words, there are now loops among metal fill geometries only. There are five more metal geometries introduced in FIG. 24 compared to FIG. 23, but the power mesh structure is more robust in term of IR-drop.

On the other hand, while some embodiments of the system add maximum number of connections between metal fill geometries and power mesh geometries, the approach in other embodiments do not preclude in any way the possibility of reducing the amount of redundancy between metal fill geometries and power mesh geometries. This may be desirable in regions where IR-drop is not an issue and hence redundant connectivity is unnecessary. Thus, it may be desirable to not maximize the redundancy between metal fill and power mesh geometries to reduce the total number of metal fill geometries inserted. This may also be desirable in regions where maximum via density rules are violated if too many vias are added. FIG. 25 illustrates the same circuit as FIG. 23, except that metal fill to power mesh connections 2302c, 2302f, and 2302h are removed, and metal fill to metal fill connections 2301c and 2301d are removed. The metal fill geometries are still all tied to the power mesh structures. Although the amount of redundancy is less, the tied metal fill solution depicted in FIG. 25 still helps reducing IR-drop compared to a traditional tied metal filling solution without any redundancy.

To recap, an embodiment of the disclosed system adds a sufficient number of additional metal fill geometries to connect metal fill geometries to power mesh geometries, and to connect metal fill geometries to other metal fill geometries, as illustrated in FIG. 23. In an alternative embodiment of the system more redundant connections may be added in the entire circuit or some regions of the circuit, as illustrated in FIG. 24, with the purpose of making the power mesh structure even more robust, or of satisfying minimum via density requirements. In yet another embodiment, the system may add fewer or no redundant connections in the entire circuit or some regions of the circuit, as illustrated in FIG. 25, with the purpose of reducing the number of geometries introduced, or of satisfying maximum via density requirements.

In order to maximize all opportunities for achieving redundancy, the system may be configured to take advantage of all possible ways to make connections between metal fill geometries and power mesh geometries, and among metal fill geometries. FIGS. 26A and 26B depict three different ways to connect metal fill geometries to power mesh geometries. The first kind of connection is a "wrong-way tap", connecting a metal fill geometry and an adjacent power mesh geometry on the same layer running in the same direction. This is illustrated in FIG. 26B by the connection 2607 between metal fill geometry 2604 and power mesh geometry 2601a, all on M5. The second kind of connection is a "straight tap", connecting a metal fill geometry and a power mesh geometry on the same layer. This is illustrated in FIG. 26B by the connection 2609 between metal fill geometry 2606 and power mesh geometry 2601b, all on M5. The difference between a "wrong-way tap" and a "straight tap" is mainly that "straight tap" is like an extension of the metal fill geometry into the power mesh, but the difference is inconsequential. The third kind of connection is a "via tap", connecting a metal fill geometry and a power mesh geometry on adjacent layers. This is illustrated in FIG. 26B by the via connection 2608 between metal fill geometry 2605 on M5 and the power mesh geometry 2602a on M6. It is noted that the via connection 2608 depicted in FIG. 26B is an "array via" that comprises of 3 cut rectangles arranged in order. In practice the number of cut rectangles in the via connection depends on the design rules, and the amount of overlap available.

Similarly, there are multiple ways the system can make connections among metal fill geometries. FIGS. 27A and 27B depict three different ways to connect metal fill geometries to power mesh geometries. The first kind of connection is a "wrong-way tap", as depicted by the connection 2704 between metal fill geometries 2701a and 2701b on M5. The second kind of connection is a "straight tap", as depicted by the connection 2706 between metal fill geometries 2703a and 2703b on M5. The third kind of connection is a "via tap", as depicted by the via connection 2702b between metal fill geometries 2702a on M5 and 2702b on M6.

In some embodiments, it may be advantageous to leverage all possible ways to form connections between metal fill geometries and power mesh geometries, and between metal fill geometries and other metal fill geometries. In one embodiment, the system utilizes at least six different connection types. First, wrong-way taps between metal fill and power mesh. Second straight taps between metal fill and power mesh. Third, via taps between metal fill and power mesh. Fourth, wrong-way taps between metal fill and metal fill. Fifth straight taps between metal fill and metal fill. Sixth, via taps between metal fill and metal fill.

An example will be used to demonstrate the importance of such said flexibility. FIG. 28A shows the layout of a circuit with two vertical power meshes on M5 and heavy signal routing on M6. In comparison to the circuit in FIG. 3, the circuit in FIG. 28A provides a more manageable approach in some embodiments because typically power meshes are much further apart than the ones depicted in FIG. 3. Hence, among all the horizontal routing tracks, most are already occupied by some signal routing geometries and there are few, if any, empty tracks that run the distance between the two meshes. FIG. 28B shows the result of metal filling using the preferred embodiment of the present invention, in which redundantly tied metal fill geometries are inserted, not only satisfying the metal density requirement but also forming many additional conducting paths between the two power meshes, such as the path from label 2801 to label 2802, and the path from label 2803 to label 2804, hence reducing the resistance between the two meshes and improving the IR-drop robustness of the power mesh.

FIG. 28C illustrates the same circuit as FIG. 28B except that "appendices" of metal fill geometries—portion of the metal fill network that are not part of any simple path between power meshes—are not displayed. In other words, FIG. 28C only shows the portion of the metal fill network that is part of the supplemental power mesh. The majority of the metal fill geometries in FIG. 28C are part of the supplemental power mesh. It is noted that appendices do not contribute to any improvement in IR-drop. Moreover, in conventional approaches of tied metal filling solutions, all metal fill geometries created are appendices and hence they do not contribute to any IR-drop improvement.

In the example in FIG. 28C, the extensive supplemental power mesh is made possible by the extensive use of both "via taps" to power mesh geometries, and "wrong-way taps" among metal fill geometries. In other situations, "straight taps", "wrong-way taps" to power mesh geometries and "via taps" among metal fill geometries may be more important.

FIG. 28D illustrates the same circuit as FIG. 28A except that the conductive metal stripes are used to satisfy metal density violations as were described previously with respect to U.S. Pat. No. 6,305,000. Note that all conductive metal stripes are aligned in the preferred direction of the layer, and the conductive metal stripes are not inter-connected to each other. A conductive metal stripe can augment the power mesh, but only if the conductive metal stripe connects to the power mesh at multiple locations. An example is metal stripe 2807 illustrated in FIG. 28D, which connects to the power mesh at locations 2805 and 2806. FIG. 28E is the same layout as FIG. 28D except that all appendices are not shown to clearly illustrate the portion of the metal fill network that augments the power mesh. It is noted that metal stripe 2807 is indeed the only such augmentation. One of ordinary skill in the art will recognize that the further apart the power meshes, the less likely it is for conductive metal stripes to connect to the power mesh at multiple locations. This is because the likelihood of having a completely unobstructed routing track between power meshes is inversely related to the distance between the power meshes.

Comparing FIG. 28C and FIG. 28E, both of which are metal fill solutions of the circuit depicted in FIG. 28A, it is easy to recognize that a system in accordance with embodiments disclosed herein is able to make far more redundant connections to aid the robustness of the power mesh. In practice, the six types of connections that were described earlier—wrong-way taps, straight taps, and via taps between metal fill geometries and power mesh geometries, and between metal fill geometries and other metal fill geometries—are advantageous to the construction of a robust power mesh. The flexibility in the types of connections allows us to adopt a style of pervasively redundant connection, and hence improve the IR-drop robustness of the power mesh globally throughout the circuit.

When there are multiple power nets in the circuit forming multiple power meshes, the system is faced with multiple choices on the connection between metal fill geometries and power mesh geometries. The embodiments disclosed herein allow for very flexible approaches to choosing which power nets to connect to. For example, in one embodiment, connection between metal fill and power meshes are made in a greedy fashion (or first-come-first-serve). As candidate connections between metal fill geometries and power meshes are found, they are connected immediately if the connection satisfies design rules and does not cause a short. In another embodiment, connection between metal fill and power meshes are made based on the priority of the power nets. For example, upon initial IR-drop analysis it may be determined that VDD has a bigger IR-drop problem than GND in one region, but less IR-drop problem in another region. Thus, tied connection to VDD will be given a higher priority in the first said region, in that metal fill to VDD mesh connections will be evaluated prior to metal fill to GND mesh connections, in order to focus on strengthening the VDD mesh in the first said region. Similarly, tied connection to GND will be given a higher priority in the second said region, in that metal fill to GND mesh connections will be evaluated prior to metal fill to VDD mesh connections.

In yet another embodiment, the choice of metal fill to power mesh connections may be determined by a prescribed desirable connectivity factor. For example, it may be determined, through initial IR-drop analysis or other means, that 70% of all redundantly tied connections should be tied to VDD, and 30% tied to GND in a given region, and that the ratio should be 50% and 50% in another region. The system can also be configured to prioritize the candidate connections in different ways to achieve the desirable percentage, such as by using a biased random number generator to break tie when a metal fill can be tied to either VDD or GND. It is noted that different priority scheme results in different connection patterns or different IR-drop improvement to different power networks. For example, FIG. 29A illustrates a circuit that is redundantly tied at approximately 50% VDD and 50% GND, and FIG. 29B illustrates the same region of that circuit but redundantly tied with VDD given the higher priority over GND. Hence, most of the metal fill geometries in FIG. 29B are tied to VDD with the exception of 2901, which is tied to GND only because no available connection to VDD is found.

Again, while particular embodiments and applications of the present invention have been illustrated and described, it is to be understood that they are not limited to the precise construction and components disclosed herein and that various modifications, changes and variations, which will be apparent to those skilled in the art, may be made in the arrangement, operation and details of the method and apparatus of the present invention disclosed herein without departing from the spirit and scope of the present invention as defined in the appended claims.

FIG. 30 is a flow chart of a preferred embodiment of the invention for redundantly tying metal fill geometries to optimize the IR drop and the metal density requirements. The steps in the flow chart may be implemented using a conventional electronic design automation ("EDA") system configuration having an EDA tool for designing a circuit layout. Step 3001 begins a process during the design stage in which floating metal fill geometries are added to the design in order to satisfy the metal density requirements. Here, any conventional metal fill techniques, such as sprinkle fill, metal stripes, or mixed shapes, can be used. Next step is 3002, in which the system finds candidate connections between metal fill and power mesh geometries, and candidate connections between metal fill and metal fill geometries. In one embodiment, the system partitions the circuit into multiple regions and process one region at a time. Within one region, the system seeks all possible candidate connections at a time. However, there is no restriction or preclusion as to how candidate connections are generated and in what order. Other input, such as a priori IR-drop analysis and early metal density analysis may be used to influence how candidate connections are generated. For example, it may be desirable to focus only on regions that fail IR-drop requirements or metal density requirements, and ignore other regions that already satisfy the requirements.

In branch 3003, the system determines if all possible candidates have been exhausted, or that the process can be terminated early. One reason for early termination is that all metal density requirements and IR-drop requirements have been satisfied. This may require an incremental IR-drop analysis and/or an incremental metal density analysis. If there is no candidate left or it is desirable to terminate early, the system will delete all floating metal fill geometries (metal fill geometries that were never connected to any power or ground mesh geometries) in step 3007 if the decision is to do so, according to the test in branch 3004. Otherwise, the system proceeds to step 3006.

In step 3006, the system picks the first candidate connection from the list of candidates found in step 3002 according to certain predetermined priority. The candidate connection can be a connection between a metal fill geometry and a power mesh geometry. The candidate connection can also be a connection between a metal fill geometry and another metal fill geometry. Again, the invention allows for a multitude of schemes to pick the next candidate. In one scheme, same-layer connections may be preferred over different-layer connections because via connections incur additional manufacturing cost. In another scheme, connection to power mesh geometry is preferred over connection between metal fill geometries to ensure that all paths are "shallow" connection from the power mesh geometries, and that serendipitous metal-fill paths are avoided whenever possible.

It is possible that no such candidate is found, because the candidate list may be exhausted. This is determined by the branch 3011. If no candidates are found, the system goes back to step 3002 to find more candidates. Otherwise, the system proceeds to branch 3012 to determine if the candidate connection, if it is made, will cause any design rule violations (DRCs) or shorts. Design rule violations can happen if, for example, the via connection is too close to another recently-added metal fill via in close proximity. Short may occur, for example, if the connection is between two metal fill geometries that are already connected to different power nets. Although it is wise to select only DRC-free and short-free candidate connections in step 3002, some DRC violations or short violations cannot be determined until this step. If the candidate connection will result in a DRC, the candidate is rejected, and the system goes back to step 3006. Otherwise, the system proceeds to branch 3013.

In branch 3013, the system has a valid candidate connection that can be formed without causing design-rule violations or short. If this candidate is a connection between a metal fill geometry and a power mesh geometry, the system proceeds to step 3019 to form the connection. This is because the system seeks maximum connectivity between metal fill and power mesh geometries. If this is a metal fill to metal fill candidate connection, the system proceeds to branch 3017 to test whether this is a "loop-free" connection as discussed previously. If it is a "loop-free" connection, the system proceeds to step 3019. Otherwise, the system goes to branch 3018 to see if the candidate connection, which is not "loop-free", is acceptable. A looped connection may be acceptable for a variety of reasons discussed previously, such as to provide extra robustness in regions with significant IR-drop problem. If the connection is deemed unacceptable, the system goes back to step 3006 to pick the next candidate. Otherwise, the system proceeds to step 3019 to form the connection.

In step 3019, the actual connection is created, and in step 3020, certain connectivity information (such as the "Union-Find" data structure) and netlist information is updated to reflect the connection. For example, if a group of previously floating metal fill geometries is connected to a group of metal fill geometries tied to VDD, then all of the floating metal fill geometries now assume the voltage of VDD. This information can also be maintained and updated easily using another "Union-Find" data structure. Once the update is completed, the system proceeds to step 3006 to pick the next candidate connection.

In summary, redundantly tied metal fill geometries significantly increase the mesh density. The increase in the mesh density greatly reduces the IR drop because the effective resistance in the conductor is reduced since there are more pathways for current flow. Thus, the present invention advantageously uses the metal fill geometries to simultaneously reduce IR drop and meet the metal density requirements. Furthermore, the layout geometry is kept small by using a partial redundancy design, i.e., keeping the redundancy in connections low by avoiding unnecessary metal fill to metal fill connections.

Now referring to FIG. 31A, there is shown a contour map depicting the IR-drop measurement of a circuit layout before redundantly tied metal fill geometries are inserted. As shown, the contour diagram depicts the IR-drop level at different location of the layout, anywhere from 5% to 35% below the nominal voltage of the power. 35% is a significant voltage drop, and may result in poor performance or even failed chip. This region at 35% represents an area that is resistively farthest from the current source. FIG. 31B shows a contour map depicting areas with metal density violations for the same circuit layout, where 20% is the minimum density requirement. In general, metal density map has no correlation to the IR-drop contour map because metal density and IR-drop are two distinct and unrelated circuit properties.

FIG. 32A shows a contour map depicting the IR-drop measurement of the same circuit as that of FIG. 31A after redundantly tied metal filling. Here, the effective resistance is reduced as a result of greater mesh density. Thus, the diagram shows a significantly less IR drop as a result of the greater mesh density. Comparing FIG. 32A to FIG. 31A, it is evident that both the peak IR-drop and the average IR-drop are significantly reduced after redundantly tied metal fill geometries are introduced. FIG. 32B shows the metal density violation for the same circuit layout. The diagram shows a significantly improved metal density due to the insertion of metal fill geometries. Thus, there are significantly fewer regions with metal density violations in FIG. 32B than in FIG. 31B.

The circuit used in FIGS. 31A, 31B, 32A, and 32B, and the IR-drop contour maps and metal density violation maps are for illustration purposes only where the percentages shown do not necessary represent actual results, but are otherwise representative of real circuits to which the preferred embodiment of the present invention has been applied. Those skilled in the art will recognize that the reduction in IR-drop and metal density violations may vary depending on the actual circuit, metal density requirements, electrical properties, and so on.

Upon reading this disclosure, those skilled in the art will appreciate still alternative systems and methods for redundantly tying metal fill geometries for IR-drop and layout density optimization with the disclosed principles of the present invention. Thus, while particular embodiments and applications of the present invention have been illustrated and described, it is to be understood that the invention is not limited to the precise construction and components disclosed herein and that various modifications, changes and variations, which will be apparent to those skilled in the art, may be made in the arrangement, operation and details of the method and apparatus of the present invention disclosed herein without departing from the spirit and scope of the present invention as defined in the appended claims.

What is claimed is:

1. A method of tying metal fill geometries in an integrated circuit, comprising steps of:
   defining a power mesh structure on a plurality of metal layers on the integrated circuit, wherein the power mesh structure is electrically connected to a plurality of power rails wherein the plurality of power rails are on a layer of the integrated circuit;
   adding a plurality of metal fill geometries to portions of the integrated circuit in response to a predetermined metal density requirement;
   electrically connecting a first metal fill geometry to the power mesh structure, wherein the first metal fill geometry is redundantly connected with the power mesh structure; and
   electrically connecting a second metal fill geometry to the first metal fill geometry, wherein the second metal fill geometry has a partial redundant connection with the first metal fill geometry such that there exists at least one electrical path between the first metal fill geometry and the second metal fill geometry that does not go through a redundant connection.

2. The method of claim 1, further comprising electrically connecting a third metal fill geometry to the first metal fill geometry.

3. The method of claim 1, wherein the first metal fill geometry and the second metal fill geometry are in different layers of the integrated circuit.

4. The method of claim 1, further comprising removing a metal fill geometry not electrically connected with the power mesh structure.

5. The method of claim 1, wherein the plurality of metal fill geometries are connected to satisfy a predetermined IR-drop requirement.

6. The method of claim 1, wherein redundant electrical connections are used to electrically connect the first metal fill geometry to the power mesh structure.

7. The method of claim 1, wherein a metal fill to metal fill interlevel connection satisfies a loop-free test.

8. An integrated circuit comprising:
   a power mesh structure on a plurality of layers on the integrated circuit, wherein the power mesh structure is electrically connected to a plurality of power rails wherein the plurality of power rails are on a layer of the integrated circuit;
   a plurality of metal fill geometries in empty portions of the integrated circuit to satisfy metal density requirements;
   a first metal fill geometry electrically connected to the power mesh structure, wherein the first metal fill geometry is redundantly connected to the power mesh structure; and
   a second metal fill geometry electrically connected to the first metal fill geometry, wherein the second metal fill geometry has a partial redundant connection to the first metal fill geometry such that there exists at least one electrical path between the first metal fill geometry and the second metal fill geometry that does not go through a redundant connection.

9. The integrated circuit of claim 8, further comprising a third metal fill geometry of the plurality of metal fill geometries connected to the first metal fill geometry.

10. The integrated circuit of claim 8, wherein the first metal fill geometry and the second metal fill geometry are in different layers of the integrated circuit.

11. The integrated circuit of claim 8, wherein each metal fill geometry is electrically connected to the power mesh structure.

12. The integrated circuit of claim 8, wherein the IR-drop requirements are satisfied.

13. The integrated circuit of claim 8, wherein redundant electrical connections are used to electrically connect the first metal fill geometry to the power mesh structure.

14. The integrated circuit of claim 8, wherein a metal fill to metal fill interlevel connection satisfies a loop-free test.

15. A method of tying metal fill geometries in an integrated circuit, comprising:
   defining a power mesh structure on a plurality of metal layers on the integrated circuit, wherein the power mesh structure is electrically connected to a plurality of power rails wherein the plurality of power rails are on a layer of the integrated circuit;
   adding a plurality of metal fill geometries to portions of the integrated circuit in response to a predetermined metal density requirement;
   electrically connecting a first metal fill geometry to the power mesh structure, wherein the first metal fill geometry is redundantly connected with the power mesh structure; and
   electrically connecting a second metal fill geometry to the first metal fill geometry, wherein the second metal fill geometry is partially redundantly connected with the first metal fill geometry; and
   removing a metal fill geometry not electrically connected with the power mesh structure.

16. A method of tying metal fill geometries in an integrated circuit, comprising:
   defining a power mesh structure on a plurality of metal layers on the integrated circuit, wherein the power mesh structure is electrically connected to a plurality of power rails wherein the plurality of power rails are on a layer of the integrated circuit;
   adding a plurality of metal fill geometries to portions of the integrated circuit in response to a predetermined metal density requirement;
   electrically connecting a first metal fill geometry to the power mesh structure, wherein the first metal fill geometry is redundantly connected with the power mesh structure; and
   electrically connecting a second metal fill geometry to the first metal fill geometry such that a predetermined IR-drop requirement is satisfied, wherein the second metal fill geometry is partially redundantly connected with the first metal fill geometry.

17. The method of claim 16, further comprising electrically connecting a third metal fill geometry to the first metal fill geometry.

18. The method of claim 16, wherein the first metal fill geometry and the second metal fill geometry are in different layers of the integrated circuit.

19. A method of tying metal fill geometries in an integrated circuit, comprising:

defining a power mesh structure on a plurality of metal layers on the integrated circuit, wherein the power mesh structure is electrically connected to a plurality of power rails wherein the plurality of power rails are on a layer of the integrated circuit;

adding a plurality of metal fill geometries to portions of the integrated circuit in response to a predetermined metal density requirement;

electrically connecting a first metal fill geometry to the power mesh structure, wherein the first metal fill geometry is redundantly connected with the power mesh structure; and electrically connecting a second metal fill geometry to the first metal fill geometry, wherein the second metal fill geometry is partially redundantly connected with the first metal fill geometry such that a loop-free test is satisfied.

20. An integrated circuit comprising:

a power mesh structure on a plurality of layers on the integrated circuit, wherein the power mesh structure is electrically connected to a plurality of power rails wherein the plurality of power rails are on a layer of the integrated circuit;

a plurality of metal fill geometries in empty portions of the integrated circuit to satisfy metal density requirements;

a first metal fill geometry electrically connected to the power mesh structure, wherein the first metal fill geometry is redundantly connected to the power mesh structure; and a second metal fill geometry electrically connected to the first metal fill geometry such that a predetermined IR-drop requirement is satisfied, wherein the second metal fill geometry is partially redundantly connected to the first metal fill geometry.

21. The integrated circuit of claim 20 further comprising a third metal fill geometry of the plurality of metal fill geometries connected to the first metal fill geometry.

22. The integrated circuit of claim 20, wherein the first metal fill geometry and the second metal fill geometry are in different layers of the integrated circuit.

23. An integrated circuit comprising:

a power mesh structure on a plurality of layers on the integrated circuit, wherein the power mesh structure is electrically connected to a plurality of power rails wherein the plurality of power rails are on a layer of the integrated circuit;

a plurality of metal fill geometries in empty portions of the integrated circuit to satisfy metal density requirements;

a first metal fill geometry electrically connected to the power mesh structure, wherein the first metal fill geometry is redundantly connected to the power mesh structure; and a second metal fill geometry electrically connected to the first metal fill geometry, wherein the second metal fill geometry is partially redundantly connected to the first metal fill geometry, such that a loop-free test is satisfied.

* * * * *